(12) United States Patent
Chen et al.

(10) Patent No.: US 12,170,236 B2
(45) Date of Patent: Dec. 17, 2024

(54) METHOD FOR FORMING PACKAGE STRUCTURE

(71) Applicant: Taiwan Semiconductor Manufacturing Company, Ltd., Hsinchu (TW)

(72) Inventors: Chih-Hao Chen, Taipei (TW); Chih-Chien Pan, Taipei (TW); Li-Hui Cheng, New Taipei (TW); Chin-Fu Kao, Taipei (TW); Szu-Wei Lu, Hsinchu (TW)

(73) Assignee: TAIWAN SEMICONDUCTOR MANUFACTURING COMPANY, LTD, Hsinchu (TW)

( * ) Notice: Subject to any disclaimer, the term of this patent is extended or adjusted under 35 U.S.C. 154(b) by 0 days.

(21) Appl. No.: 18/302,223

(22) Filed: Apr. 18, 2023

(65) Prior Publication Data
US 2023/0253276 A1    Aug. 10, 2023

Related U.S. Application Data

(63) Continuation of application No. 17/372,814, filed on Jul. 12, 2021, now Pat. No. 11,664,286, which is a continuation of application No. 16/548,165, filed on Aug. 22, 2019, now Pat. No. 11,062,968.

(51) Int. Cl.
| | |
|---|---|
| *H01L 23/18* | (2006.01) |
| *H01L 21/56* | (2006.01) |
| *H01L 23/00* | (2006.01) |
| *H01L 23/31* | (2006.01) |
| *H01L 23/498* | (2006.01) |

(52) U.S. Cl.
CPC ............ *H01L 23/18* (2013.01); *H01L 21/565* (2013.01); *H01L 23/3185* (2013.01); *H01L 23/49816* (2013.01); *H01L 24/81* (2013.01)

(58) Field of Classification Search
CPC .............................. H01L 21/565; H01L 24/81
See application file for complete search history.

(56) References Cited

U.S. PATENT DOCUMENTS

| | | |
|---|---|---|
| 5,120,678 A | 6/1992 | Moore et al. |
| 5,929,512 A | 7/1999 | Jacobs |
| 6,455,936 B1 * | 9/2002 | Lo ......................... H05K 1/0271 257/730 |
| 8,993,380 B2 | 3/2015 | Hou et al. |
| 9,281,254 B2 | 3/2016 | Yu et al. |
| 9,299,649 B2 | 3/2016 | Chiu et al. |
| 9,372,206 B2 | 6/2016 | Wu et al. |
| 9,425,126 B2 | 8/2016 | Kuo et al. |

(Continued)

*Primary Examiner* — Peniel M Gumedzoe
(74) *Attorney, Agent, or Firm* — McClure, Qualey & Rodack, LLP

(57) ABSTRACT

A method for forming a package structure is provided. The method includes bonding a package component to a substrate through a plurality of first connectors. The package component comprises a first semiconductor die and a second semiconductor die. The method also includes forming a dam structure over the substrate and surrounding the first connectors. A top surface of the dam structure is lower than a bottom surface of the package component. The method further includes filling an underfill layer in a space between the dam structure and the first connectors. In addition, the method includes removing the dam structure after the underfill layer is formed.

20 Claims, 24 Drawing Sheets

(56) References Cited

U.S. PATENT DOCUMENTS

| | | |
|---|---|---|
| 9,443,783 B2 | 9/2016 | Lin et al. |
| 9,461,018 B1 | 10/2016 | Tsai et al. |
| 9,496,189 B2 | 11/2016 | Yu et al. |
| 9,627,329 B1 | 4/2017 | Kwon et al. |
| 9,666,502 B2 | 5/2017 | Chen et al. |
| 9,735,131 B2 | 8/2017 | Su et al. |
| 10,347,562 B1 | 7/2019 | Nicholls et al. |
| 10,438,863 B1* | 10/2019 | Boja ..................... H01L 21/52 |
| 2003/0203542 A1 | 10/2003 | Chee |
| 2006/0027841 A1 | 2/2006 | Tamaki |
| 2006/0163749 A1 | 7/2006 | Lee |
| 2011/0210436 A1* | 9/2011 | Chow ................... H01L 21/563 |
| | | 438/109 |
| 2015/0048503 A1 | 2/2015 | Chiu et al. |
| 2015/0303173 A1* | 10/2015 | Maydar ............... H01L 21/6835 |
| | | 257/664 |
| 2017/0125264 A1 | 5/2017 | Do et al. |
| 2018/0342466 A1 | 11/2018 | Lin |
| 2019/0067148 A1 | 2/2019 | Wu |

\* cited by examiner

METHOD FOR FORMING PACKAGE STRUCTURE

CROSS REFERENCE TO RELATED APPLICATIONS

This application is a Continuation of pending U.S. patent application Ser. No. 17/372,814, filed Jul. 12, 2021 and entitled "METHOD FOR FORMING PACKAGE STRUCTURE", now U.S. Pat. No. 11,664,286, which claims the benefit of U.S. patent application Ser. No. 16/548,165, filed Aug. 22, 2019 and entitled "PACKAGE STRUCTURE AND METHOD FOR FORMING THE SAME", now U.S. Pat. No. 11,062,968, the entirety of which are incorporated by reference herein.

BACKGROUND

Semiconductor devices are used in a variety of electronic applications, such as personal computers, cell phones, digital cameras, and other electronic equipment. These semiconductor devices are fabricated by sequentially depositing insulating or dielectric layers, conductive layers, and semiconductor layers over a semiconductor substrate, and patterning the various material layers using lithography and etching processes to form circuit components and elements on the semiconductor substrate.

The semiconductor industry continues to improve the integration density of various electronic components (e.g., transistors, diodes, resistors, capacitors, etc.) by continual reductions in minimum feature size, which allow more components to be integrated into a given area. These smaller electronic components also use a smaller package that utilizes a smaller area or a lower height, in some applications.

New packaging technologies have been developed to improve the density and functionality of semiconductor dies further. For example, three-dimensional integrated circuit (3D-IC) packages have been developed. These relatively new types of packaging technologies for semiconductor dies face manufacturing challenges, and they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
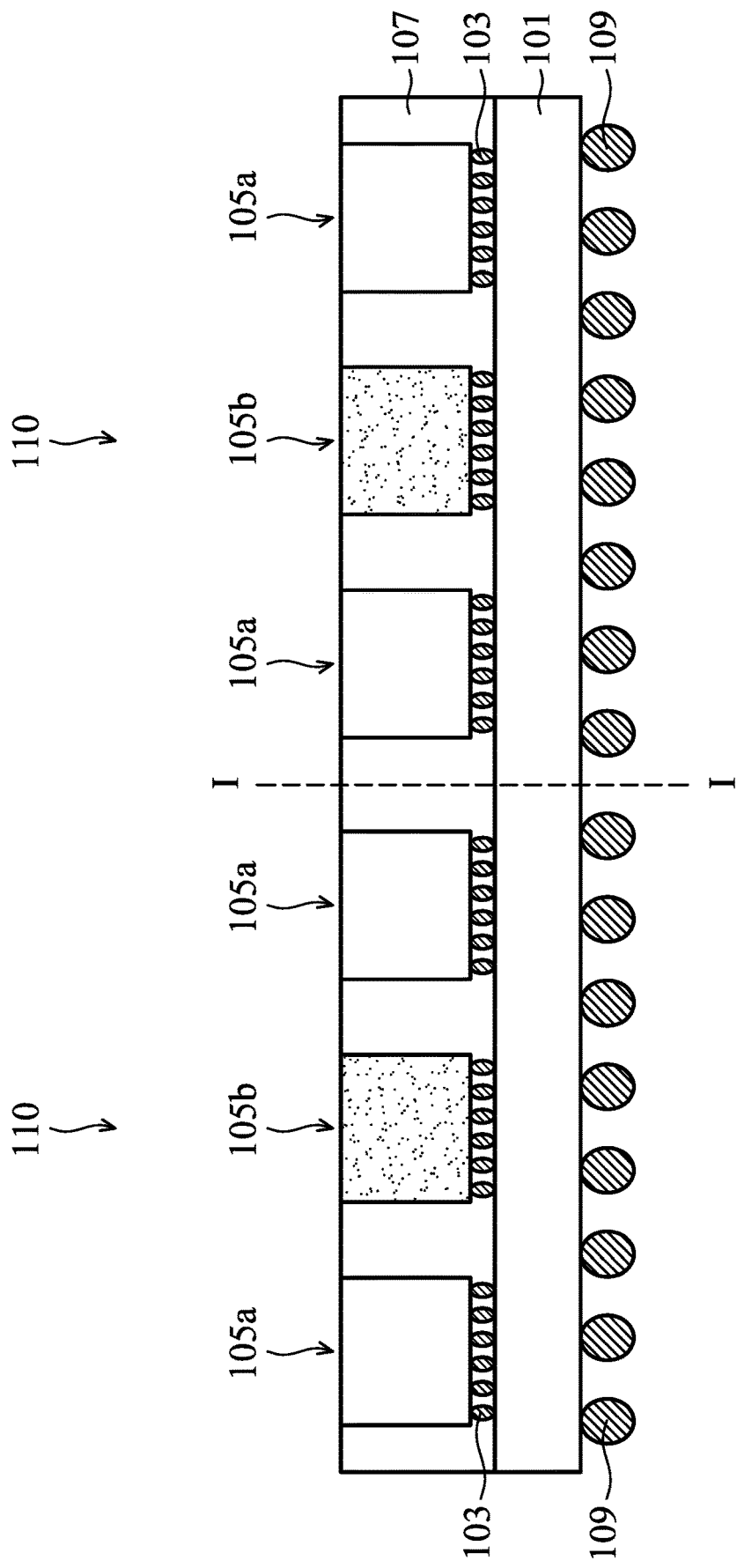
FIGS. 1A to 1F are cross-sectional views of various stages of a process for forming a package structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, so that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Embodiments of the disclosure may relate to 3D packaging or 3D-IC devices. Other features and processes may also be included. For example, testing structures may be included to aid in the verification testing of the 3D packaging or 3D-IC devices. The testing structures may include, for example, test pads formed in a redistribution layer or on a substrate that allows the testing of the 3D packaging or 3D-IC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Embodiments for forming a package structure are provided. The method for forming the package structure may include bonding a package component to a substrate, forming a dam structure over the substrate, forming an underfill layer between the dam structure and the package component, and removing the dam structure after the underfill layer is formed. By forming the underfill layer between the dam structure and the package component, the size and profile of the underfill layer may be controlled. Therefore, delamination problem, such as cracks grown in the underfill layer along the interface between the package component and the underfill layer, may be mitigated or eliminated.

FIGS. 1A to 1F are cross-sectional views of various stages of a process for forming a package structure 100a, in accordance with some embodiments of the disclosure.

A dicing process is performed on an interposer wafer 101 with first semiconductor dies 105a, second semiconductor dies 105b and connectors 109, as shown in FIG. 1A in accordance with some embodiments. More specifically, in some embodiments, the first semiconductor dies 105a and the second semiconductor dies 105b are bonded to a surface of the interposer wafer 101 through connectors 103, and the connectors 109 are bonded to the other surface of the interposer wafer 101 which is opposite to the surface that the first semiconductor dies 105a and the second semiconductor dies 105b are bonded to. In addition, the first semiconductor dies 105a, the second semiconductor dies 105b and the connectors 103 are surrounded by a molding compound layer 107, in accordance with some embodiments.

In some embodiments, the interposer wafer 101 has a substrate (not shown) and through vias (not shown) in the substrate. The substrate for the interposer wafer 101 may be, e.g., a silicon substrate, doped or undoped, or an active layer of a silicon-on-insulator (SOI) substrate, used to provide support for the interposer wafer 108. However, the substrate for the interposer wafer 101 may alternatively be a glass substrate, a ceramic substrate, a polymer substrate, or any other substrate that may provide a suitable protection and/or interconnection functionality.

The through vias in the substrate of the interposer wafer 101 may serve as conductive vias to provide electrical connections in vertical directions. In some embodiments, the through vias are formed by applying and developing a photoresist over the substrate, and then etching the substrate to generate openings. Afterwards, the openings for the through vias may be filled with a conductive layer.

The conductive layer of the through vias may be made of copper, cobalt, titanium, aluminum, tungsten, gold, platinum, nickel, one or more other applicable materials, or a combination thereof. The conductive layer may be formed by depositing a seed layer and then electroplating the conductive layer onto the seed layer, filling and overfilling the openings for the through vias. Once the openings for the through vias have been filled, excess conductive layer outside of the openings for the through vias may be removed through a planarization process.

In some embodiments, the first semiconductor dies 105a and the second semiconductor dies 105b are logic dies, system-on-chip (SoC) dies, memory dies, or other applicable dies. The memory dies may include memory devices such as static random access memory (SRAM) devices, dynamic random access memory (DRAM) devices, other suitable devices, or a combination thereof. In some embodiments, the first semiconductor dies 105a are memory dies which function as high bandwidth memories (HBM), and the second semiconductor dies 105b are SoC dies. In some embodiments, the first semiconductor dies 105a and the second semiconductor dies 105b are SoC dies.

In some embodiments, the connectors 103 are solder bumps, solder balls, other suitable connectors, or a combination thereof. In some embodiments, the connectors 103 are micro-bumps, controlled collapse chip connection (C4) bumps and/or ball grid array (BGA) bumps.

Moreover, the formation method of the molding compound layer 107 includes forming a molding compound material (not shown) covering the first semiconductor dies 105a and the second semiconductor dies 105b, and the molding compound material is thinned by using a planarization process to form a molding compound layer 107 surrounding the first semiconductor dies 105a and the second semiconductor dies 105b, in accordance with some embodiments. The molding compound material may by formed by an injecting process, a spin coating process, a spray coating process, one or more other applicable processes, or a combination thereof.

The planarization process may include a grinding process, a CMP process, a dry polishing process, an etching process, a cutting process, one or more other applicable processes, or a combination thereof. After the planarization process, the first semiconductor dies 105a and the second semiconductor dies 105b may be exposed so as to enhance heat dissipation of the first semiconductor dies 105a and the second semiconductor dies 105b.

After the planarization process for forming the molding compound layer 107, the interposer wafer 101, the connectors 103, the first semiconductor dies 105a, the second semiconductor dies 105b and the molding compound layer 107, which are bonded together, are turned upside down to form connectors 109 on the other surface of the interposer wafer 101, in accordance with some embodiments. Some materials used to form the connectors 109 may be similar to, or the same as, those used to form the connectors 103 described previously and are not repeated herein. In some embodiments, the size of the connectors 109 is larger than the size of the connectors 103.

It should be noted that the dicing process is performed along line I-I to cut the interposer wafer 101 and the molding compound layer 107 into a plurality of package components 110, as shown in FIG. 1A in accordance with some embodiments. After the dicing process is performed, a plurality of package component 110 is formed, and the interposer wafer 101 is cut into a plurality of interposer 101', in accordance with some embodiments.

In some embodiments, each of the package components 110 is a chip-on-wafer (CoW) package. Although two of the first semiconductor dies 105a and one of the second semiconductor dies 105b are illustrated in each of the package component 110 in FIG. 1A, the number of first semiconductor dies 105a and the number of second semiconductor dies 105b in each of the package component 110 are not limited thereto.

Figure 1B:
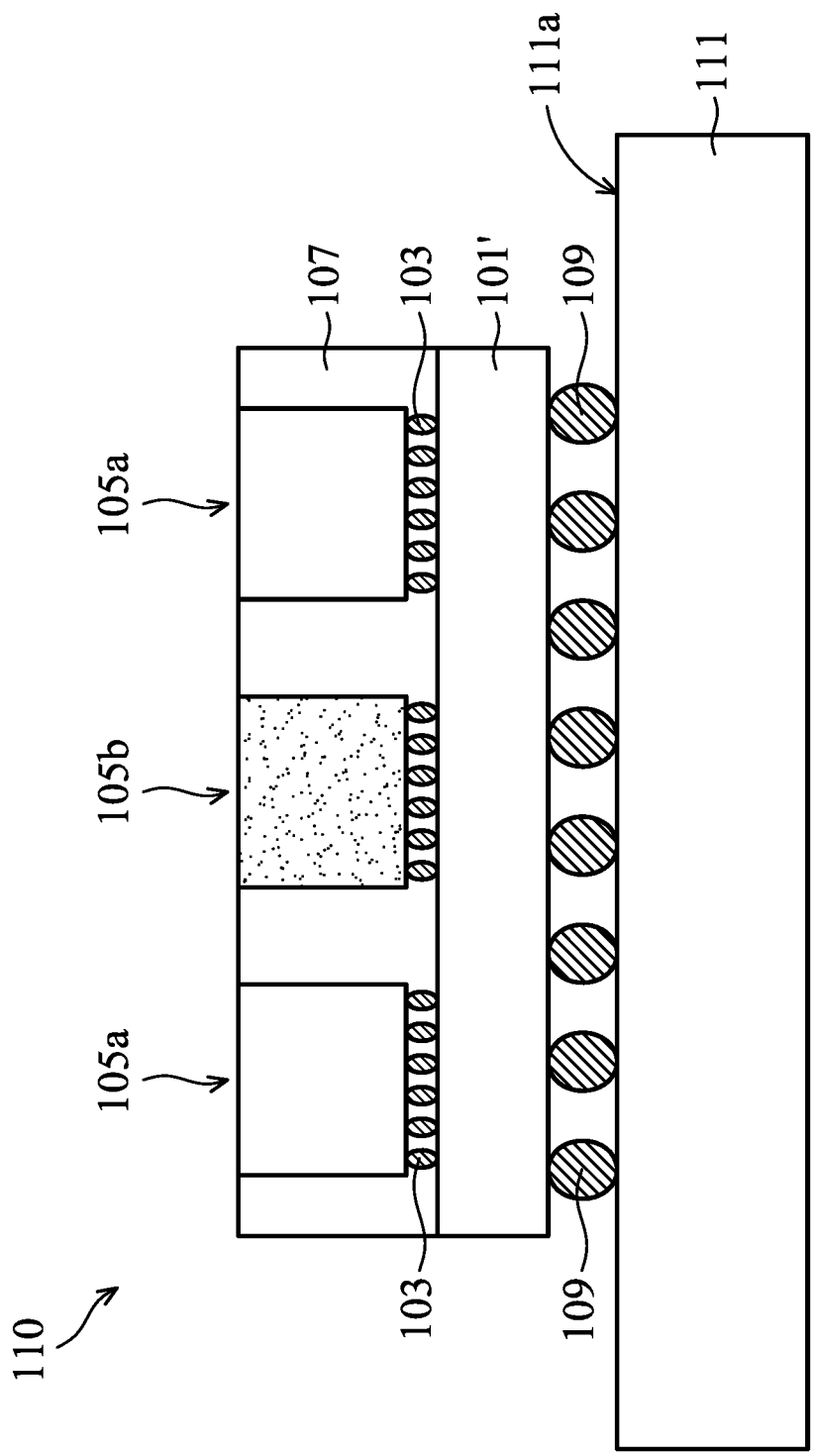

After the package components 110 are formed, one of the package component 110 is bonded to a first surface 111a of a substrate 111 through the connectors 109, as shown in FIG. 1B in accordance with some embodiments. In some embodiments, the substrate 111 is a printed circuit board (PCB), a ceramic substrate, another applicable substrate, or another package structure.

Figure 1C:
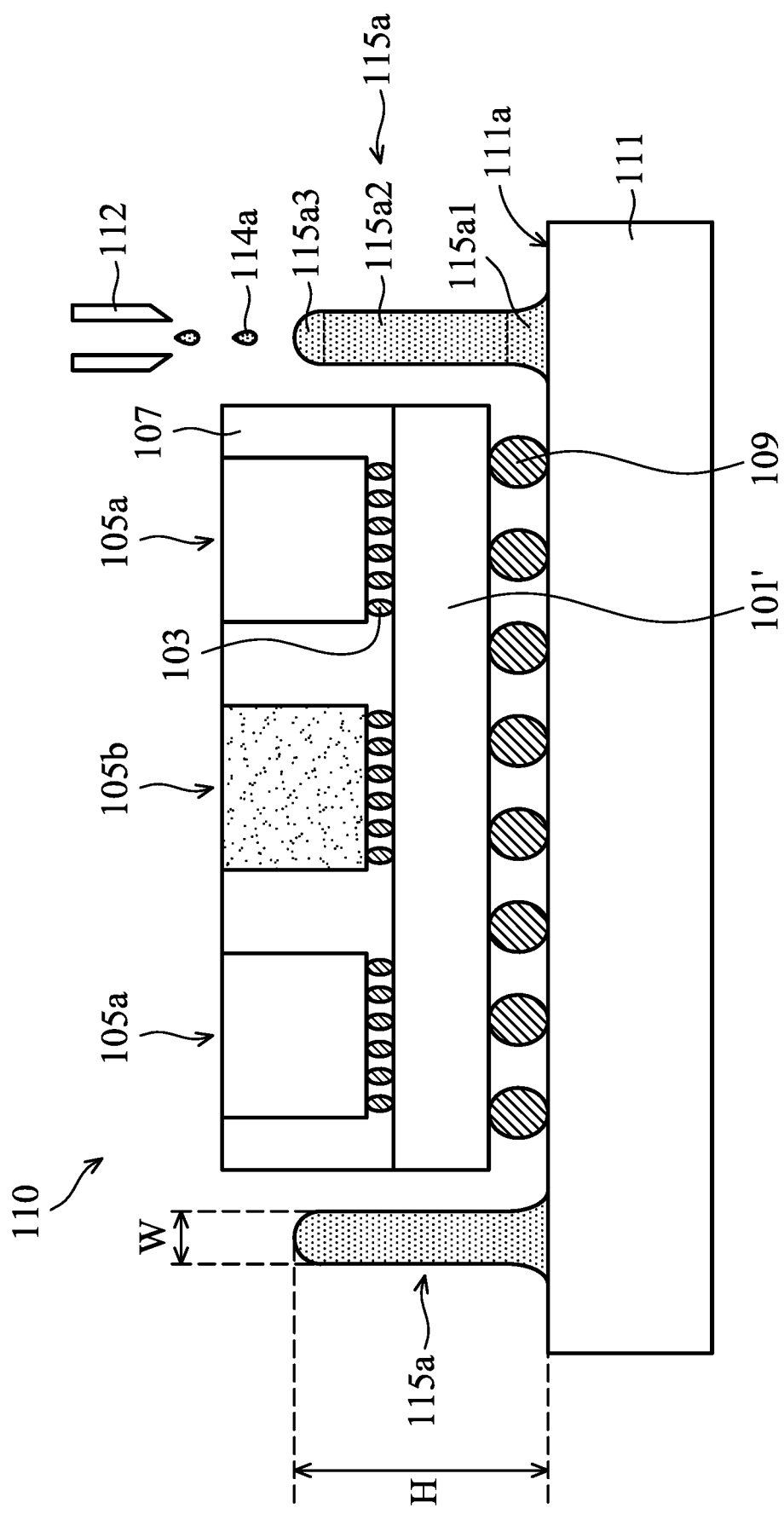

Next, a dam structure 115a is formed over the first surface 111a of the substrate 111, as shown in FIG. 1C in accordance with some embodiments. More specifically, the dam structure 115a is formed around and separated from the package component 110, in accordance with some embodiments. In some embodiments, the dam structure 115a is made of a polymer material 114a, such as acrylic-based polymer, polyimide, epoxy, another applicable material, or a combination thereof. In some embodiments, the polymer material 114a is a 3D cross-linking polymer.

The polymer material 114a of the dam structure 115a may have an etching selectivity, such as a different etching rate, from the material of the molding compound layer 107 and the material of the subsequently formed underfill layer, so that in subsequent processes, the dam structure 115a may be easily removed without causing damage to other elements in the final package structure 100a. In some embodiments, the polymer material 114a is made of a water-soluble polymer, and can be easily dissolved in water without leaving any residue.

In some embodiments, the dam structure 115a is formed by dispensing the polymer material 114a on the first surface 111a of the substrate 111 in liquid form or gel form through a dispensing tool in a device 112. More specifically, in some embodiments, the polymer material 114a is dispensed in a designated area around the package component 110. Then, the polymer material 114a over the first surface 111a of the substrate 111 is cured to form the dam structure 115a.

In some embodiments, the polymer material 114a is dispensed by an injection molding process, or another applicable dispensing process. In some embodiments, the polymer material 114a is cured by an ultraviolet (UV) curing process, a thermal curing process, or another curing process through a curing tool in the device 112 after the polymer material 114a is dispensed over the first surface 111a of the substrate.

The dam structure 115a may include a lower portion 115a1 adjoins the first surface 111a of the substrate 111, a middle portion 115a2 over the lower portion 115a1, and an upper portion 115a3 over the middle portion 115a2. It should be noted that the sidewalls of the lower portion 115a1 of the dam structure 115a are curved, and the widths of the lower portion 115a1 gradually increase along a direction from a top of the lower portion 115a1 to the substrate 111, in accordance with some embodiments.

In some embodiments, the widths of the middle portion 115a2 of the dam structure 115a are substantially the same. In addition, the top surface and sidewalls of the upper portion 115a3 of the dam structure 115a are curved, and the widths of the upper portion 115a3 gradually increase along a direction from a top of the upper portion 115a3 to the substrate 111, in accordance with some embodiments.

In some embodiments, a width W of the middle portion 115a2 of the dam structure 115a is in a range from about 50 µm to about 500 µm, and the maximum height H of the dam structure is greater than about 20 µm. The profile of the dam structure 115a may be adjusted by controlling the moving speed of the device 112 (e.g., the dispensing speed and the curing speed), and/or parameters of the curing process, such as the dosage of the UV light in the UV curing process, or the temperature in the thermal curing process. In addition, controlling the aforementioned parameters for forming the profile of the dam structure 115a may be easy and the associated costs may be lowered (e.g., the moving speed of the device 112 can be slow), and the dam structure 115a in the present embodiment can provide an enhanced process window.

Figure 1D:
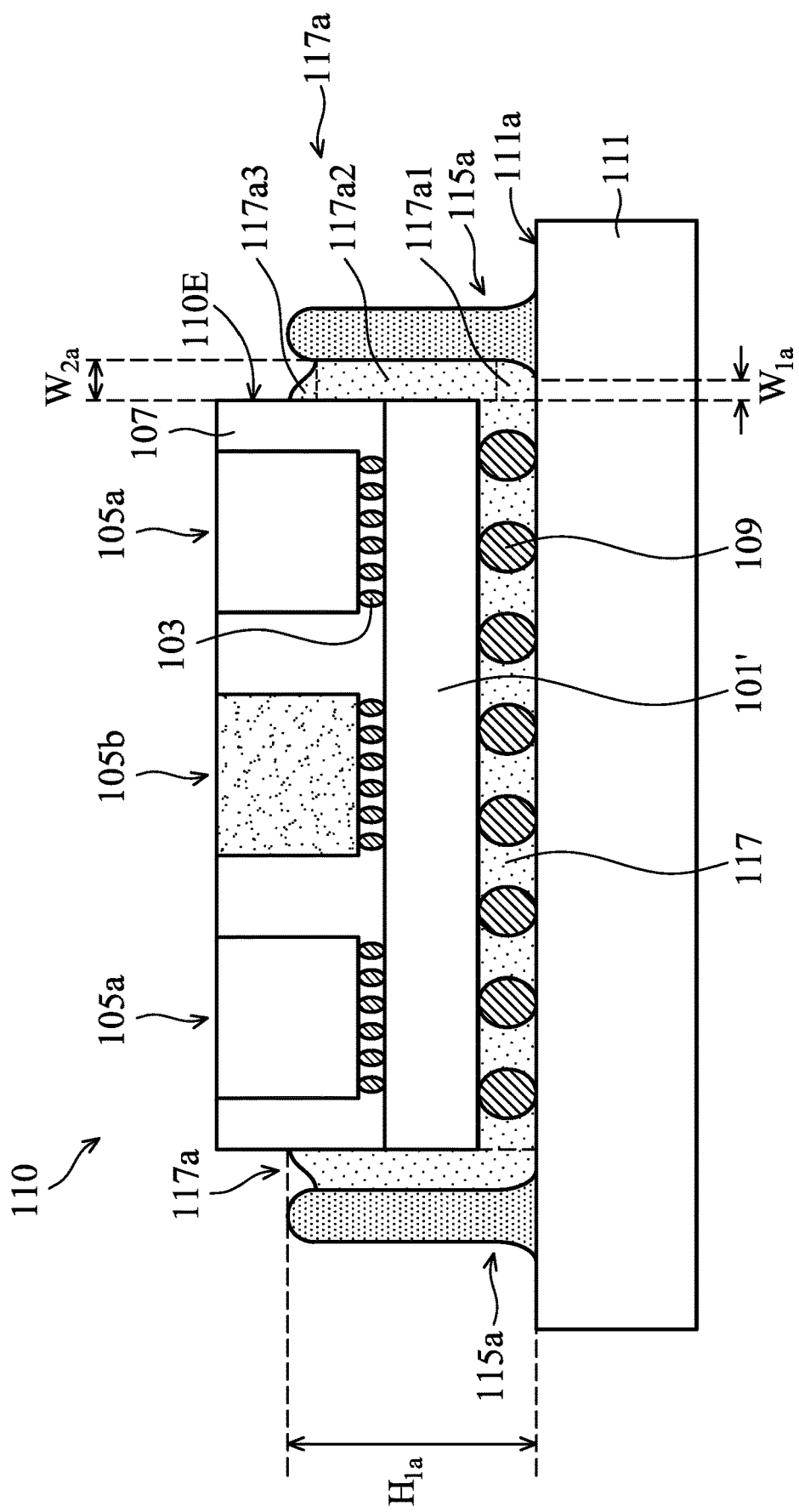

Afterwards, an underfill layer 117 is filled in the space between the package component 110 and the first surface 111a of the substrate 111, and the underfill layer 117 extends to the space between the package component 110 and the dam structure 115a, as shown in FIG. 1D in accordance with some embodiments. In particular, the underfill layer 117 has an extending portion 117a that laterally protrudes from an edge 110E of the package component 110, and the extending portion 117a is sandwiched between and in direct contact with the dam structure 115a and the package component 110, in accordance with some embodiments.

In some embodiments, the underfill layer 117 is made of liquid epoxy, deformable gel, silicon rubber, another applicable material, or a combination thereof. In addition, a dispensing process may be performed to form the underfill layer 117 by using a dispensing tool, and then the material of the underfill layer 117 may be cured to harden.

It should be noted that the material of the underfill layer 117 is different from the material of the dam structure 115a, so that the etching selectivity of the dam structure 115a with respect to the underfill layer 117 are relatively high, in accordance with some embodiments. Therefore, the dam structure 115a may be removed by the substantially etching process while the underfill layer 117 may be substantially left.

The extending portion 117a of the underfill layer 117 includes a lower portion 117a1 adjoins the first surface 111a of the substrate 111, a middle portion 117a2 over the lower portion 117a1, and an upper portion 117a3 over the middle portion 117a2. In some embodiments, the lower portion 117a1 of the extending portion 117a has a curved sidewall, and widths of the lower portion 117a1 gradually decrease along a direction from a top of the lower portion 117a1 to the substrate 111.

Moreover, in some embodiments, the widths of the middle portion 117a2 of the extending portion 117a are substantially the same. In some embodiments, the top surface of the upper portion 117a3 of the extending portion 117a, which is the topmost surface of the underfill layer 117, is curved and sloped. For example, the contact point between the underfill layer 117 and the package component 110 is higher than the contact point between the underfill layer 117 and the dam structure 115a, as shown in FIG. 1D in accordance with some embodiments. However, in some embodiments, the top surface of the upper portion 117a3 is planar.

In some embodiments, the lower portion 117a1 of the extending portion 117a has a width $W_{1a}$ in direct contact with the first surface 111a of the substrate 111, the middle portion 117a2 of the extending portion 117a has a width $W_{2a}$, and the width $W_{2a}$ is greater than the width $W_{1a}$. In addition, the extending portion 117a of the underfill layer 117 has a maximum height $H_{1a}$ over the first surface 111a of the substrate 111. In some embodiments, the ratio ($H_{1a}/W_{1a}$) of the maximum height $H_{1a}$ to the width $W_{1a}$ is greater than or equal to about 0.8.

When the ratio ($H_{1a}/W_{1a}$) of the maximum height $H_{1a}$ to the width $W_{1a}$ of the extending portion 117a is too small (e.g., less than 0.8), high stress, such as bending force, applied to the underfill layer 117 from the substrate 111 may cause delamination problem in the underfill layer 117. For example, cracks may grow in the extending portion 117a along the interface between the package component 110 and the underfill layer 117. In some embodiments, since the ratio ($H_{1a}/W_{1a}$) of the maximum height $H_{1a}$ to the width $W_{1a}$ of the extending portion 117a is greater than or equal to about 0.8, the delamination problem may be mitigated or eliminated. As a result, the quality of the package structure 100a may be improved.

Figure 1E:
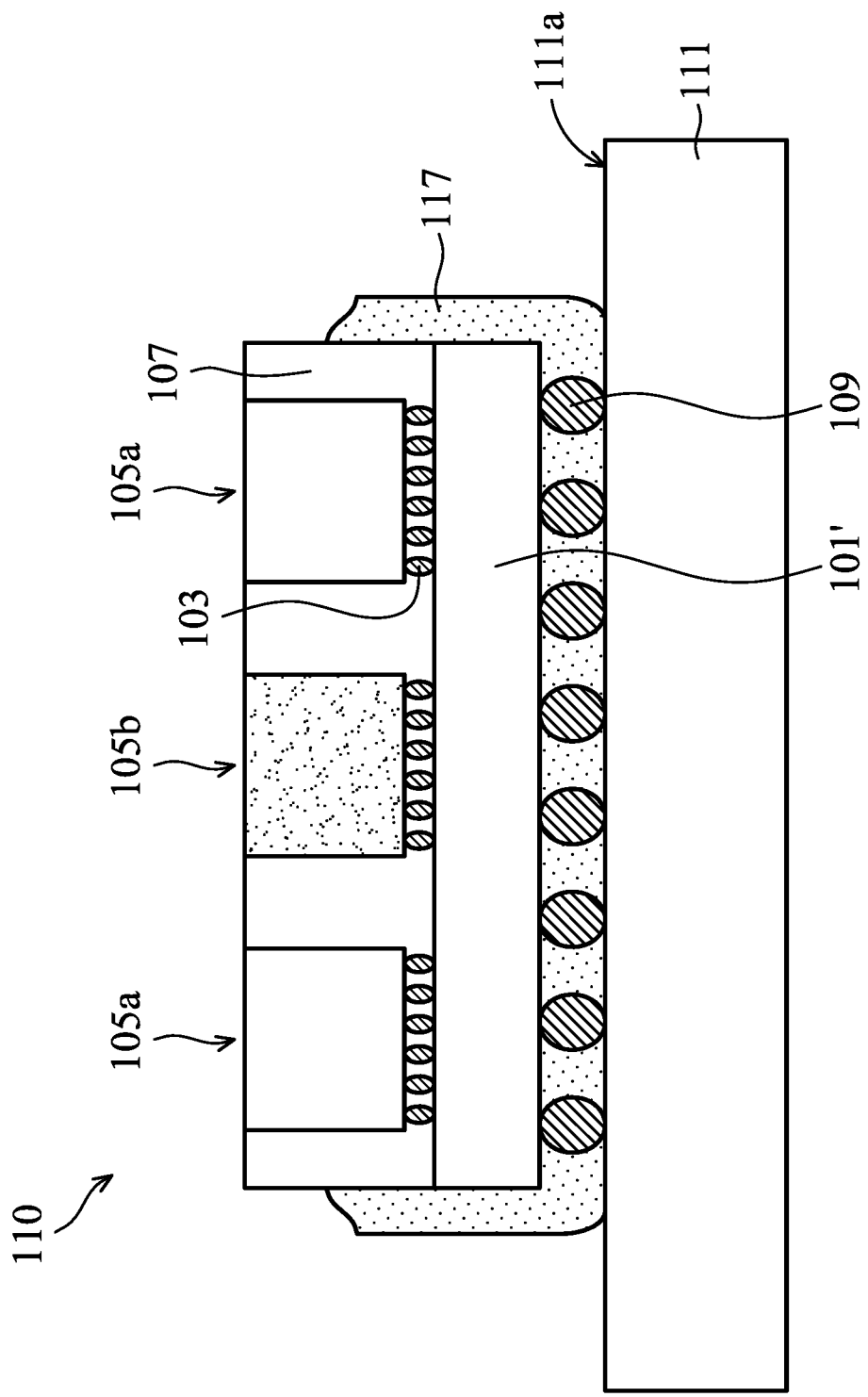

After the underfill layer 117 is formed, the dam structure 115a is removed by an etching process, as shown in FIG. 1E in accordance with some embodiments. The etching process may include a wet etching process, a dry etching process, or a combination thereof. In some embodiments, the etching process is a wet etching process using water as an etchant, and the dam structure 115a is dissolved by the water. In some embodiments, the etching process is a wet etching process using potassium hydroxide (KOH) as an etchant. It should be noted that, since the etching selectivity of the dam structure 115a with respect to the underfill layer 117 and the package component 110 are relatively high, the dam structure 115a may be easily removed without leaving any residue.

Figure 1F:
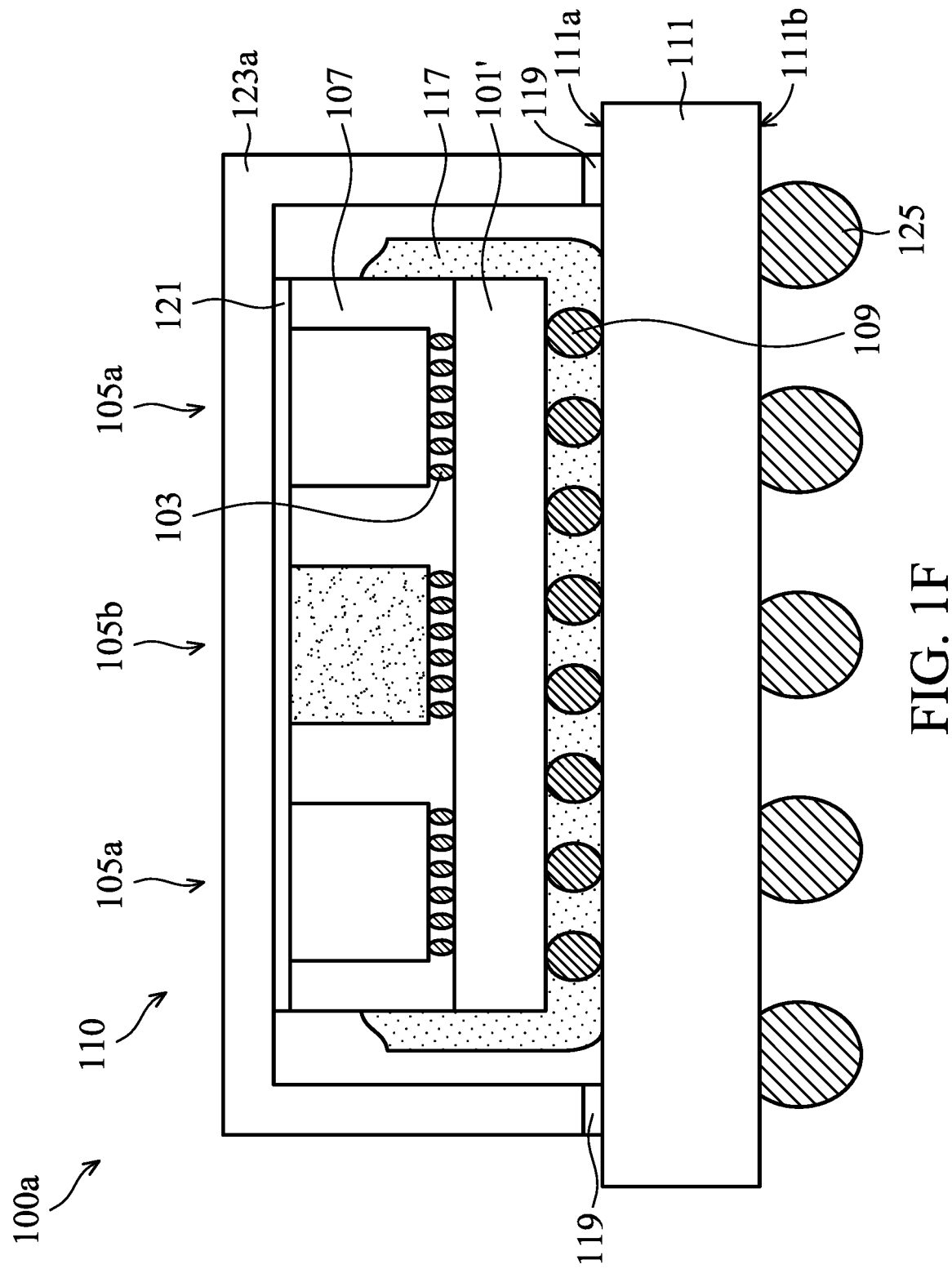

After the dam structure 115a is removed, a lid 123a is attached to the first surfaces 111a of the substrate 111 through an adhesive layer 119 and a heat dissipation paste 121, as shown in FIG. 1F in accordance with some embodiments. The adhesive layer 121 may be used to affix the lid 123a, which may be used to protect the package component 110, and the heat dissipation paste 121 may be used to enhance heat dissipation of the first semiconductor dies 105a and the second semiconductor die 105b.

The adhesive layer 121 may be glue or a tape. In some embodiments, the heat dissipation paste 121 is made of a viscous, silicone compound with mechanical properties similar to a grease or a gel. In some embodiments, the heat dissipation paste 121 is made of a silicone grease with silver, nickel, or aluminum particles suspended therein. Moreover, the lid 123a is made of copper, aluminum, another metal, an alloy, a ceramic material, or a combination thereof.

In some embodiments, the package component 110 is covered by the lid 123a. After the lid 123a is attached to the first surface 111a of the substrate 111, the substrate 111, the package structure 110 and the lid 123a, which are bonded together, are turned upside down to form connectors 125 over a second surface 111b of the substrate 111, as shown in FIG. 1F in accordance with some embodiments. The second surface 111b is opposite to the first surface 111a.

Some materials used to form the connectors 125 may be similar to, or the same as, those used to form the connectors 109 described previously and are not repeated herein. In some embodiments, the size of the connectors 125 is larger than the size of the connectors 109. After the connectors 125 are formed, the package structure 100a is obtained.

In the methods for forming the package structure 100a, the profile and the size of the extending portion 117a of the underfill layer 117 (i.e., the ratio ($H_{1a}/W_{1a}$)) is controlled by the dam structure 115a. Therefore, the delamination problem of the underfill layer 117 may be mitigated or eliminated. Moreover, since the dam structure 115a allows a reduction of the size of the substrate 111 by allowing the widths of the extending portion 117a of the underfill layer 117 (e.g., the width $W_{1a}$) to be reduced, and the dam structure 115a is removed after the underfill layer 117 is formed, the size of the package structure 100a can be reduced.

Figure 2:
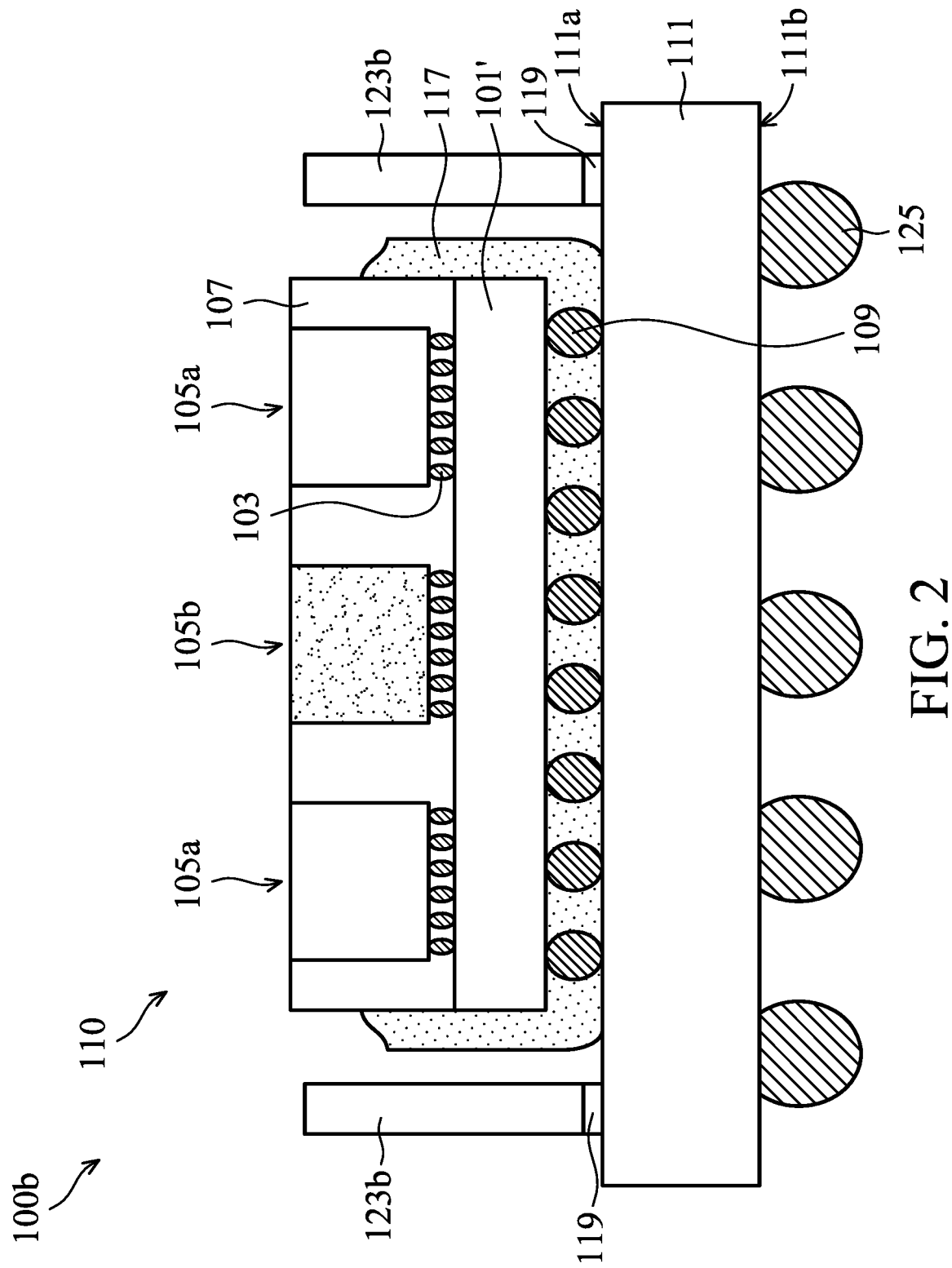
FIG. 2 is a cross-sectional view of a package structure, in accordance with some embodiments of the disclosure.

FIG. 2 is a cross-sectional view of a package structure 100b, in accordance with some embodiments of the disclosure. Some materials and processes used to form the package structure 100b shown in FIG. 2 may be similar to, or the same as, those used to form the package structure 100a shown in FIGS. 1A to 1F and are not repeated herein.

The differences between the package structure 100a of FIG. 1F and the package structure 100b of FIG. 2 are that a lid 123b, which is different from the lid 123a of package structure 100a, is attached to the first surface 111a of the substrate 111, and the heat dissipation paste 121 is not formed over the package component 110 as shown in FIG. 2 in accordance with some embodiments. In some embodiments, the package component 110 is surrounded by the lid 123b, and the top surface of the package component 110 is not covered by the lid 123b.

Figure 3A:
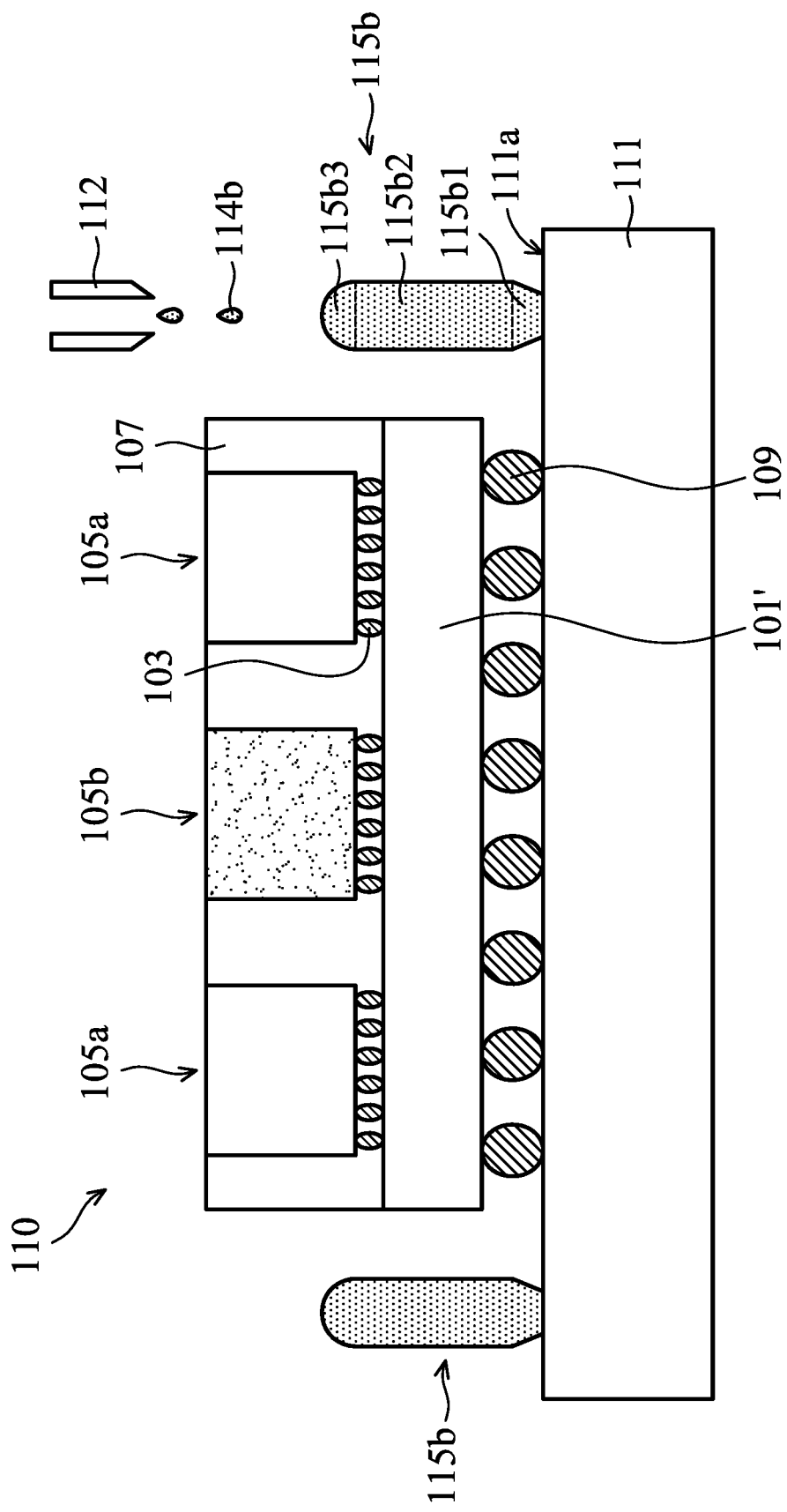
FIGS. 3A to 3C are cross-sectional views of various stages of a process for forming a package structure, in accordance with some embodiments of the disclosure.
Figure 3B:
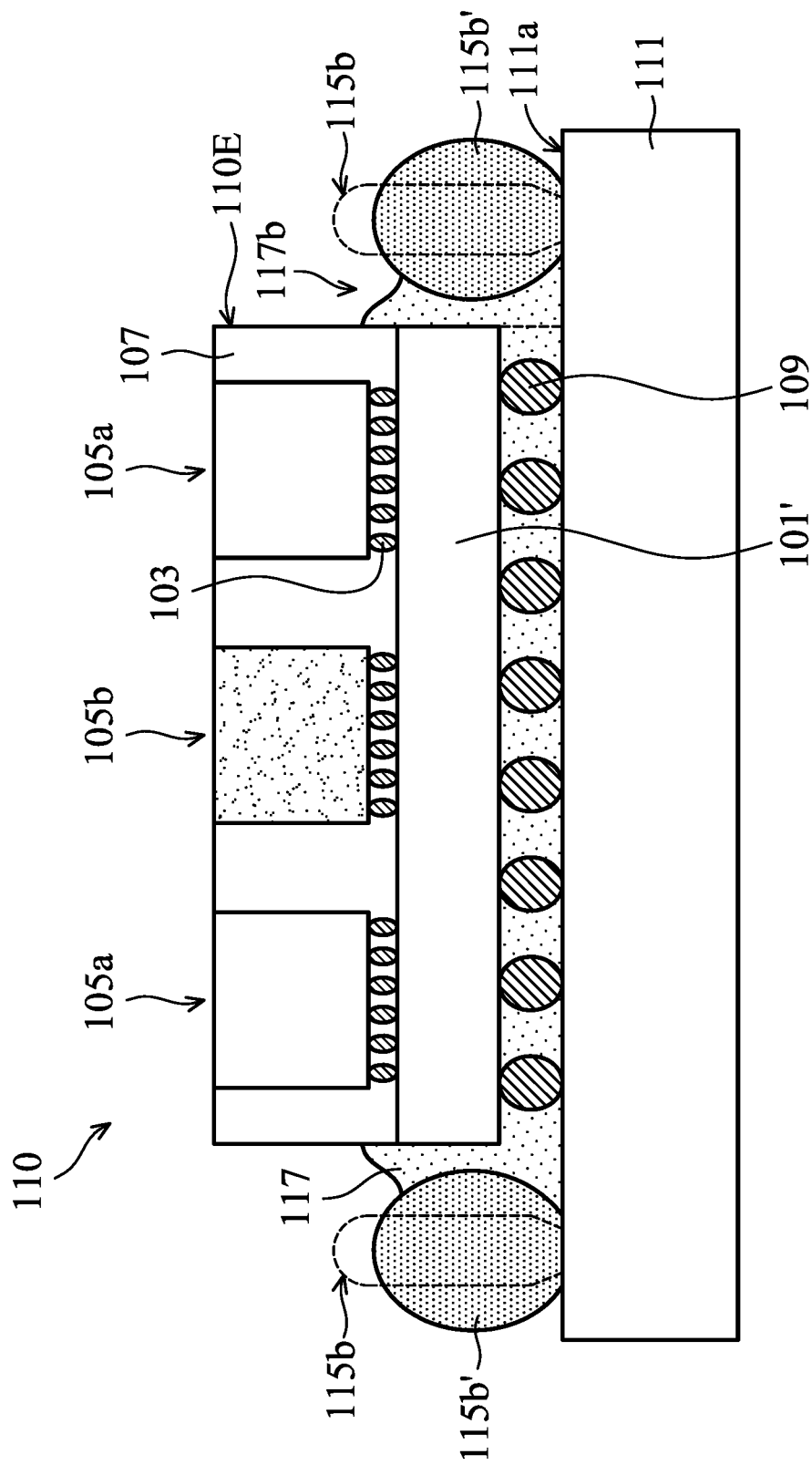
Figure 3C:
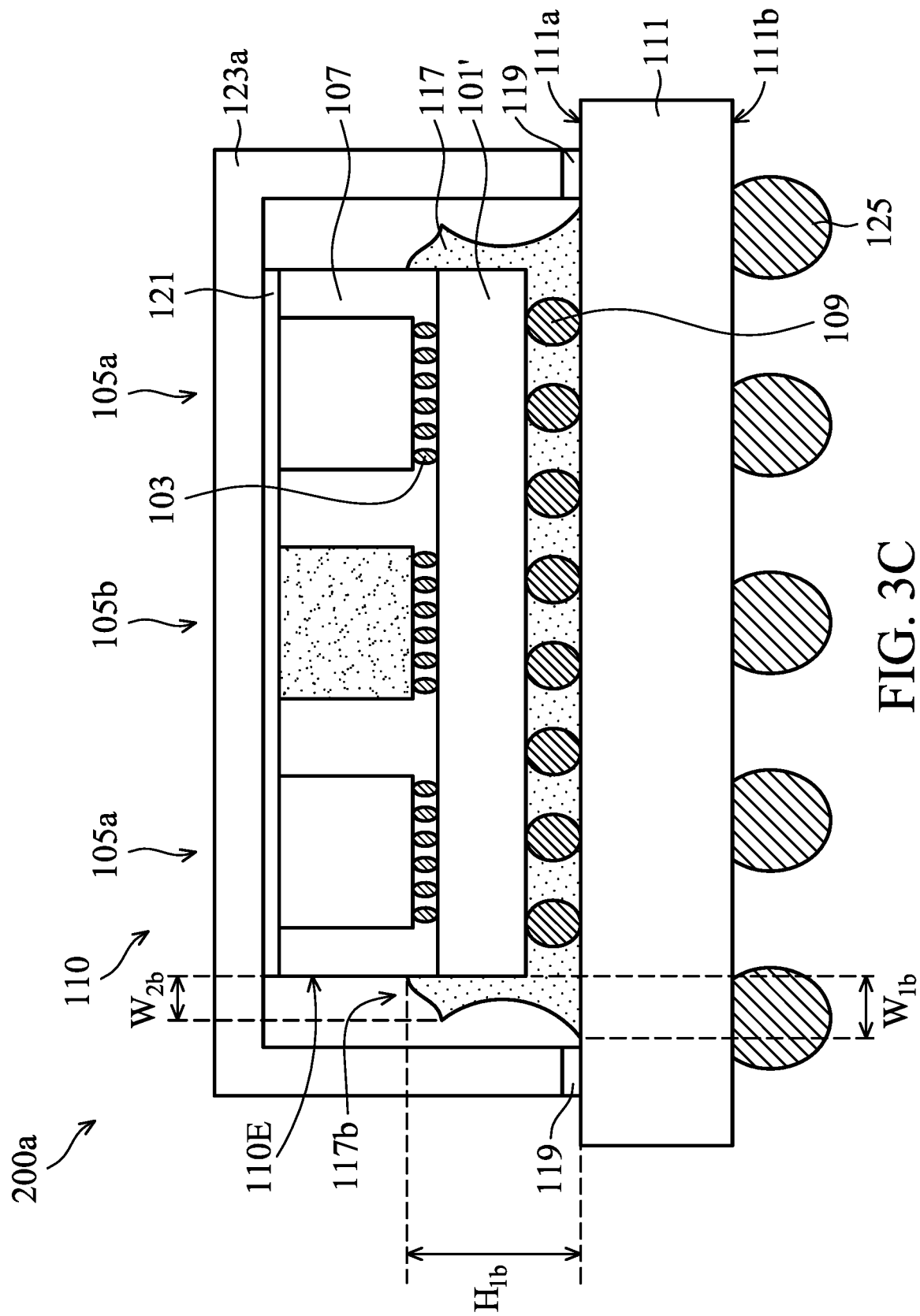

FIGS. 3A to 3C are cross-sectional views of various stages of a process for forming a package structure 200a, in accordance with some embodiments of the disclosure.

Similar to the process of FIG. 1C, a dam structure 115b is formed over the first surface 111a of the substrate 111 by dispensing and curing a polymer material 114b through the device 112, as shown in FIG. 3A in accordance with some embodiments. In some embodiments, the polymer material 114b is an acrylic-based polymer, a polyimide, an epoxy, another applicable material, or a combination thereof. In some embodiments, the polymer material 114b is a 2D cross-linking polymer.

The polymer material 114b of the dam structure 115b may have an etching selectivity, such as a different etching rate, from the material of the molding compound layer 107 and the material of the subsequently formed underfill layer, so that in subsequent processes, the dam structure 115b may be easily removed without causing damage to other elements in the final package structure 200a. In some embodiments, the polymer material 114b is made of a water-soluble polymer, and can be easily dissolved in water without leaving any residue.

Some processes used to form the dam structure 115b shown in FIG. 3A may be similar to, or the same as, those used to form the dam structure 115a shown in FIG. 1C and are not repeated herein. The dam structure 115b may include a lower portion 115b1 adjoins the first surface 111a of the substrate 111, a middle portion 115b2 over the lower portion 115b1, and an upper portion 115b3 over the middle portion 115b2. It should be noted that the widths of the lower portion 115b1 gradually decrease along a direction from a top of the lower portion 115b1 to the substrate 111, in accordance with some embodiments.

In some embodiments, the widths of the middle portion 115b2 of the dam structure 115b are substantially the same. In addition, the top surface and sidewalls of the upper portion 115b3 of the dam structure 115b are curved, and the widths of the upper portion 115b3 gradually increase along a direction from a top of the upper portion 115b3 to the substrate 111, in accordance with some embodiments. It should be noted that the profile of the dam structure 115b may be adjusted by controlling the moving speed of the device 112 (e.g., the dispensing speed and the curing speed), and/or parameters of the curing process, such as the dosage of the UV light in the UV curing process, or the temperature in the thermal curing process. For example, in order to form the dam structure 115b, the moving of the device 112 may be sped up.

Afterwards, an underfill layer 117 is formed and a dam structure 115b' is formed from the dam structure 115b, as shown in FIG. 3B in accordance with some embodiments. In some embodiments, the underfill layer 117 has an extending portion 117b that laterally protrudes from an edge 110E of the package component 110.

More specifically, in some embodiments, since the material of the dam structure 115b is a 2D cross-linking polymer, the dam structure 115b may deform during the curing process for forming the underfill layer 117. For example, the dam structure 115b may become wider and shorter during the curing process. In some embodiments, the height of the dam structure 115b' is less than the height of the dam structure 115b, and the width of the dam structure 115b' is greater than the width of the dam structure 115b.

In some embodiments, the dam structure 115b becomes wider during the curing process for hardening the underfill layer 117. Therefore, the dam structure 115b can provide a push force along a lateral direction from the dam structure 115b to the underfill layer 117, so as to further confine the size of the extending portion 117b of the underfill layer 117.

In addition, the underfill layer 117 may be formed with fewer voids inside, since the flow of the underfill layer 117 is confined by the lateral push force of the dam structure 115b during the curing process for forming the underfill layer 117. After the curing process for forming the underfill layer 117, the profile of the dam structure 115b' is nearly rounded, as shown in FIG. 3B in accordance with some embodiments.

Afterwards, similar to the processes of FIGS. 1E to 1F, the dam structure 115b is removed, the lid 123a is attached to the first surfaces 111a of the substrate 111 through the adhesive layer 119 and the heat dissipation paste 121, and the connectors 125 are bonded to the second surface 111b of the substrate 111, as shown in FIG. 3C in accordance with some embodiments. After the connectors 125 are formed, the package structure 200a is obtained. Some materials and processes used to form the package structure 200a shown in FIG. 3C may be similar to, or the same as, those used to form the package structure 100a shown in FIG. 1F and are not repeated herein.

In some embodiments, the extending portion 117b of the underfill layer 117 has a width $W_{1b}$ in direct contact with the first surface 111a of the substrate 111, the extending portion 117b has a width $W_{2b}$, which is the minimum lateral distance between the package component 110 and the contact point between the dam structure 115b' (as shown in FIG. 3B) and the underfill layer 117, and the width $W_{1b}$ is greater than the width $W_{2b}$. In addition, the extending portion 117b of the underfill layer 117 has a maximum height $H_{1b}$ over the first surface 111a of the substrate 111. In some embodiments, the ratio ($H_{1b}/W_{1b}$) of the maximum height $H_{1b}$ to the width $W_{1b}$ is greater than or equal to about 0.8, and the delamination problem can be mitigated or eliminated.

Figure 4:
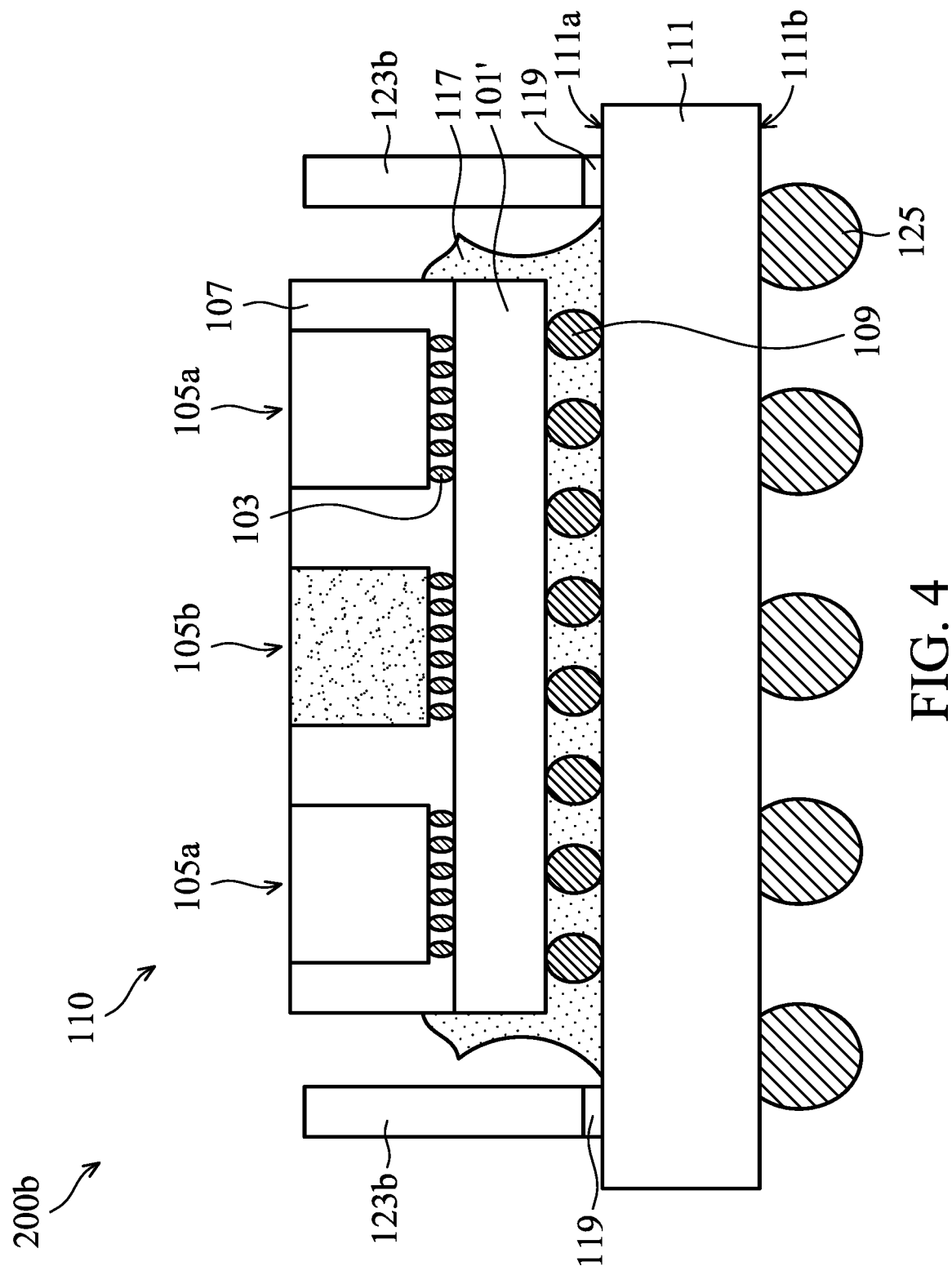
FIG. 4 is a cross-sectional view of a package structure, in accordance with some embodiments of the disclosure.

FIG. 4 is a cross-sectional view of a package structure 200b, in accordance with some embodiments of the disclosure. Some materials and processes used to form the package structure 200b shown in FIG. 4 may be similar to, or the same as, those used to form the package structure 100b shown in FIG. 2 and are not repeated herein.

The differences between the package structure 200a of FIG. 3C and the package structure 200b of FIG. 4 are that a lid 123b, which is different from the lid 123a of package structure 200a, is attached to the first surface 111a, and the heat dissipation paste 121 is not formed over the package component 110 as shown in FIG. 4 in accordance with some embodiments. In some embodiments, the package component 110 is surrounded by the lid 123b, and the top surface of the package component 110 is not coved by the lid 123b.

Figure 5A:
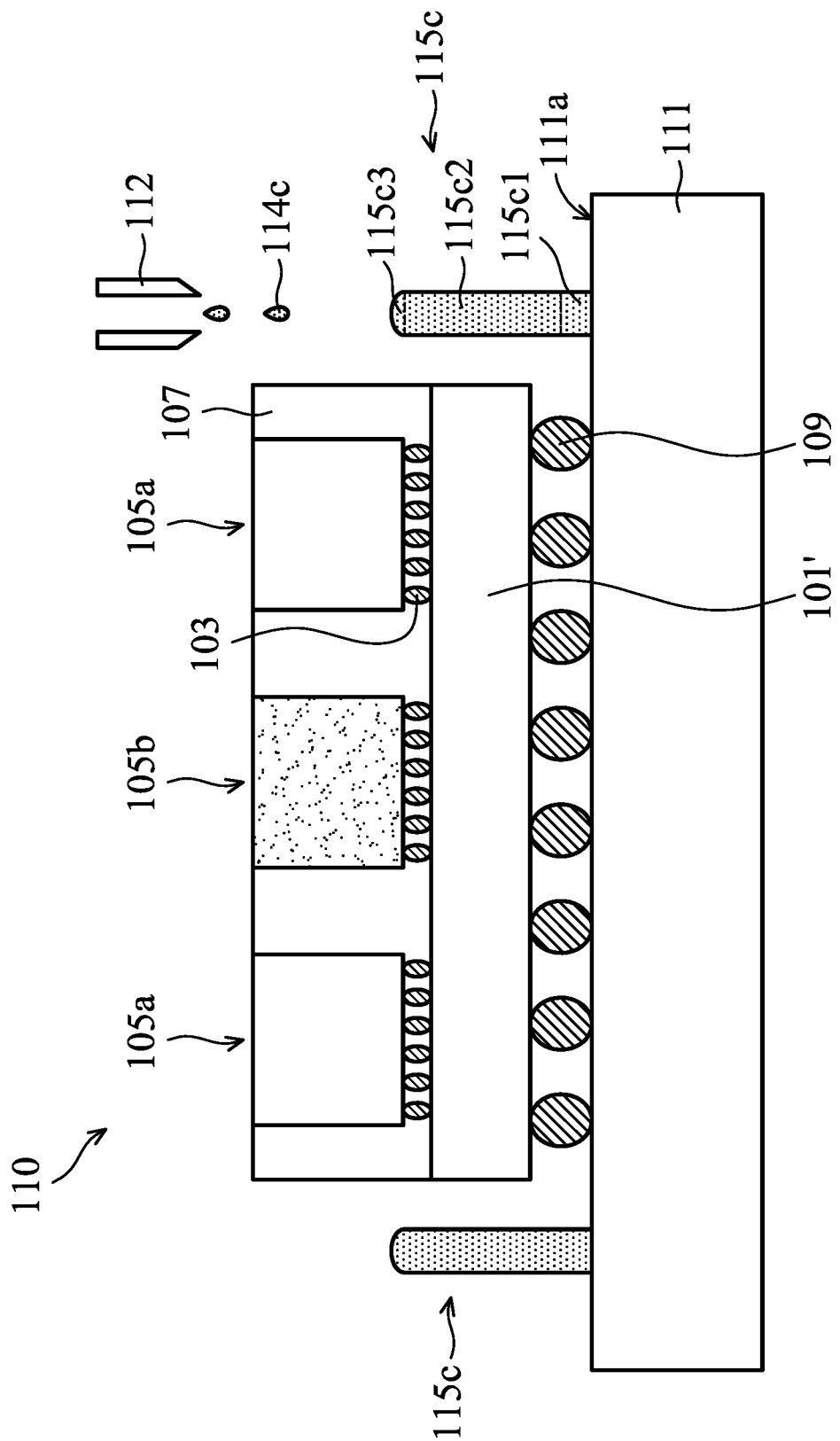
FIGS. 5A to 5C are cross-sectional views of various stages of a process for forming a package structure, in accordance with some embodiments of the disclosure.
Figure 5B:
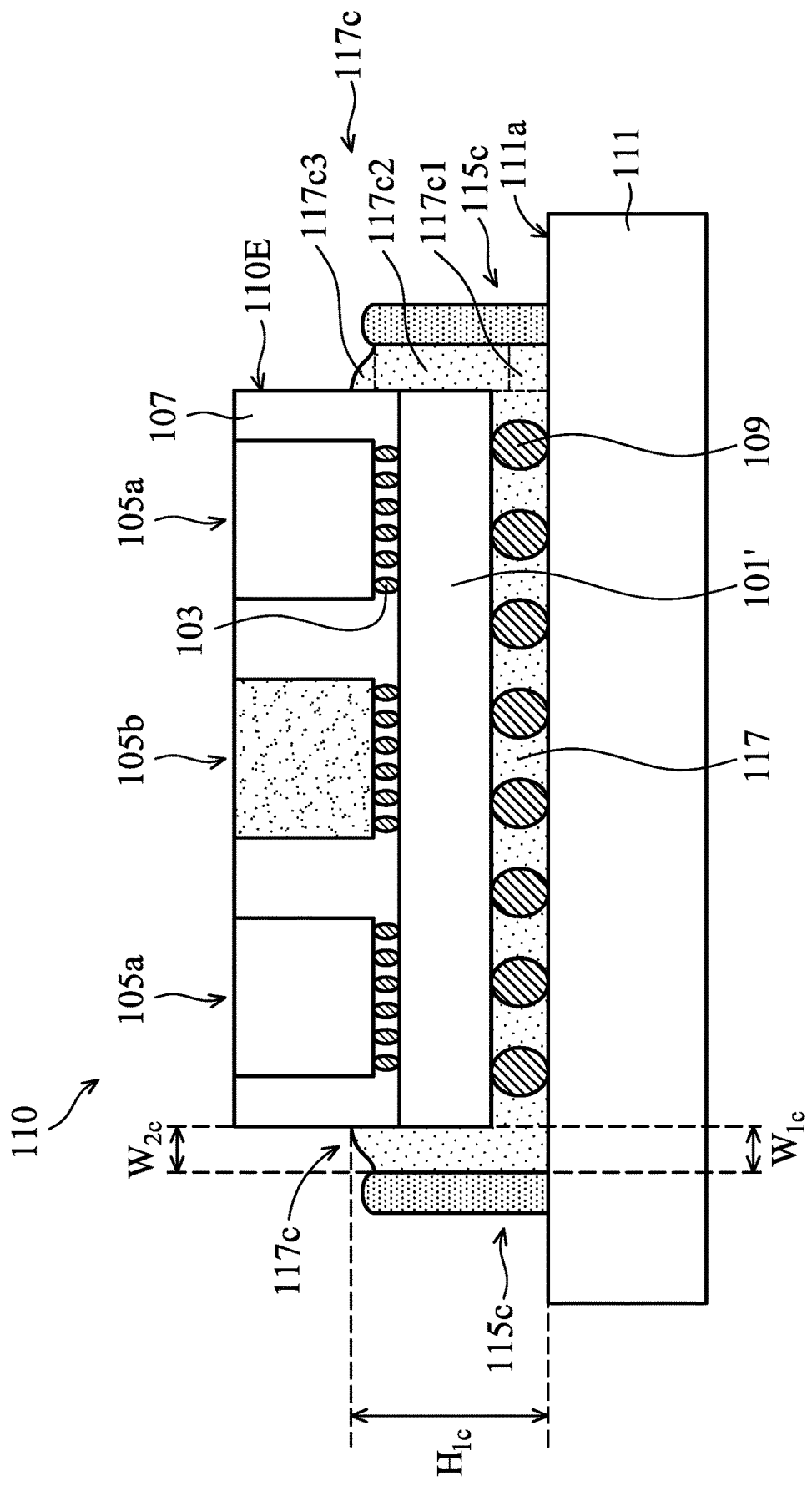
Figure 5C:
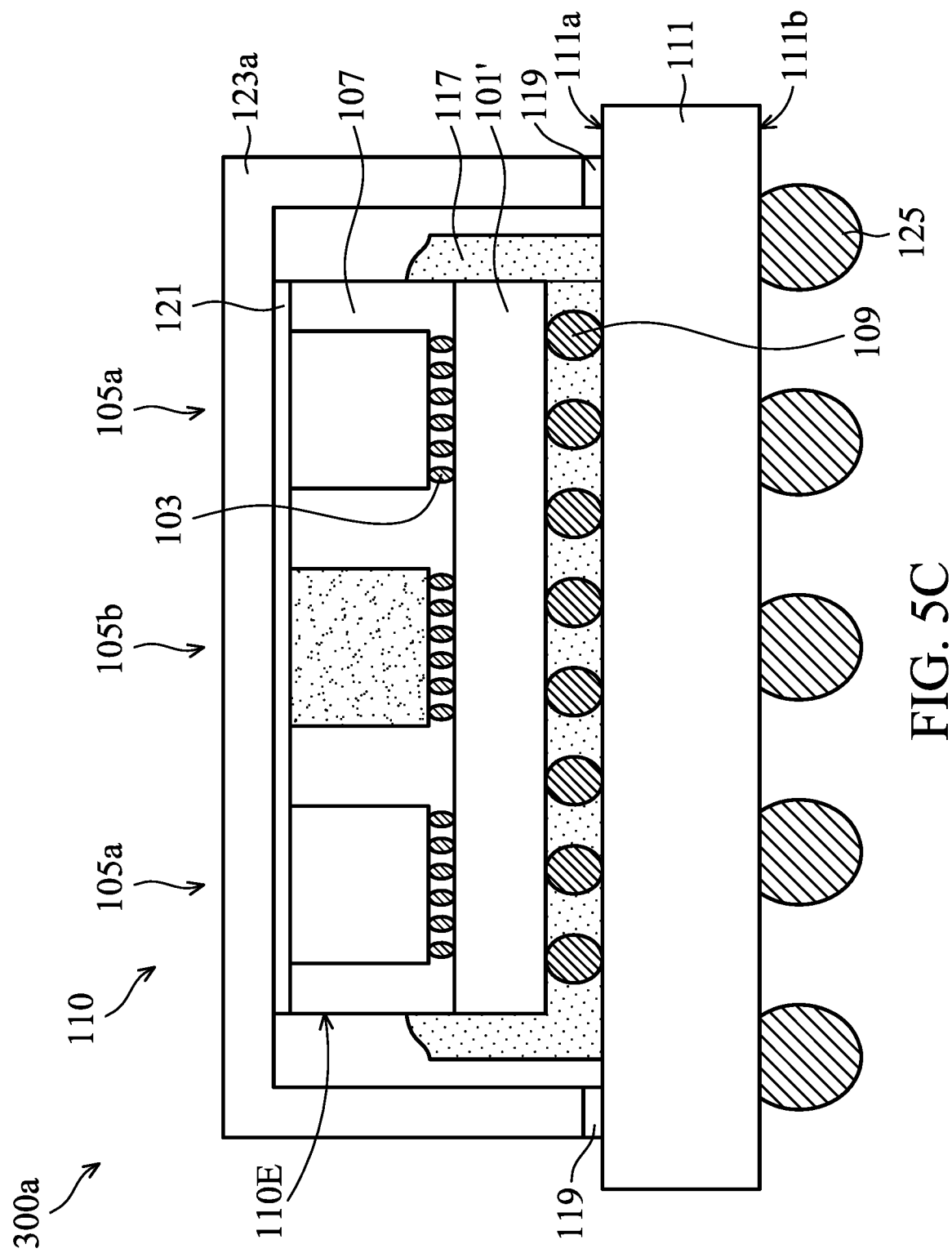

FIGS. 5A to 5C are cross-sectional views of various stages of a process for forming a package structure 300a, in accordance with some embodiments of the disclosure.

Similar to the process of FIG. 1C, a dam structure 115c is formed over the first surface 111a by dispensing and curing a polymer material 114c through the device 112, as shown in FIG. 5A in accordance with some embodiments. In some embodiments, the polymer material 114c is an acrylic-based polymer, a polyimide, an epoxy, another applicable material, or a combination thereof. In some embodiments, the polymer material 114c is a 3D cross-linking polymer.

The polymer material 114c of the dam structure 115c may have an etching selectivity, such as a different etching rate, from the material of the molding compound layer 107 and the material of the subsequently formed underfill layer, so that in subsequent processes, the dam structure 115c may be easily removed without causing damage to other elements in the final package structure 300a. In some embodiments, the polymer material 114c is made of a water-soluble polymer, and can be easily dissolved in water without leaving any residue.

Some processes used to form the dam structure 115c shown in FIG. 5A may be similar to, or the same as, those used to form the dam structure 115a shown in FIG. 1C and are not repeated herein. The dam structure 115c may include a lower portion 115c1 adjoins the first surface 111a of the substrate 111, a middle portion 115c2 over the lower portion 115c1, and an upper portion 115c3 over the middle portion 115c2. It should be noted that the widths of the lower portion 115c1 and the middle portion 115c2 are substantially the same, in accordance with some embodiments.

In addition, the top surface and sidewalls of the upper portion 115c3 of the dam structure 115c are curved, and the widths of the upper portion 115c3 gradually increase along a direction from a top of the upper portion 115c3 to the substrate 111, in accordance with some embodiments. It should be noted that the profile of the dam structure 115c may be adjusted by controlling the moving speed of the device 112 (e.g., the dispensing speed and the curing speed), and/or parameters of the curing process, such as the dosage of the UV light in the UV curing process, or the temperature in the thermal curing process. In some embodiments, the moving speed of the device 112 for forming the dam structure 115c is between the moving speeds of the device 112 for forming the dam structures 115a and 115b.

Afterwards, an underfill layer 117 is formed, as shown in FIG. 5B in accordance with some embodiments. In some embodiments, the underfill layer 117 has an extending portion 117c that laterally protrudes from an edge 110E of the package component 110.

The extending portion 117c of the underfill layer 117 includes a lower portion 117c1 adjoins the first surface 111a of the substrate 111, a middle portion 117c2 over the lower portion 117c1, and an upper portion 117c3 over the middle portion 117c2. In some embodiments, the widths of the lower portion 117c1 and the middle portion 117c2 of the underfill layer 117 are substantially the same. In addition, the top surface and sidewalls of the upper portion 117c3 of the extending portion 117c are curved, and the widths of the upper portion 117c3 gradually increase along a direction from a top of the upper portion 117c3 to the substrate 111, in accordance with some embodiments.

In some embodiments, the lower portion 117c1 of the extending portion 117c has a width $W_{1c}$ in direct contact with the first surface 111a of the substrate 111, the middle portion 117c2 of the extending portion 117c has a width $W_{2c}$, and the width $W_{2c}$ is substantially the same as the width $W_{1c}$. In addition, the extending portion 117c of the underfill layer 117 has a maximum height $H_{1c}$ over the first surface 111a of the substrate 111. In some embodiments, the ratio ($H_{1c}/W_{2c}$) of the maximum height $H_{1c}$ to the width $W_{1c}$ is greater than or equal to about 0.8, and the delamination problem can be mitigated or eliminated.

Afterwards, similar to the processes of FIGS. 1E to 1F, the dam structure 115c is removed, the lid 123c is attached to the first surfaces 111a of the substrate 111 through the adhesive layer 119 and the heat dissipation paste 121, and the connectors 125 are bonded to the second surface 111b of the substrate 111, as shown in FIG. 5C in accordance with some embodiments. After the connectors 125 are formed, the package structure 300a is obtained. Some materials and processes used to form the package structure 300a shown in FIG. 5C may be similar to, or the same as, those used to form the package structure 100a shown in FIG. 1F and are not repeated herein.

Figure 6:
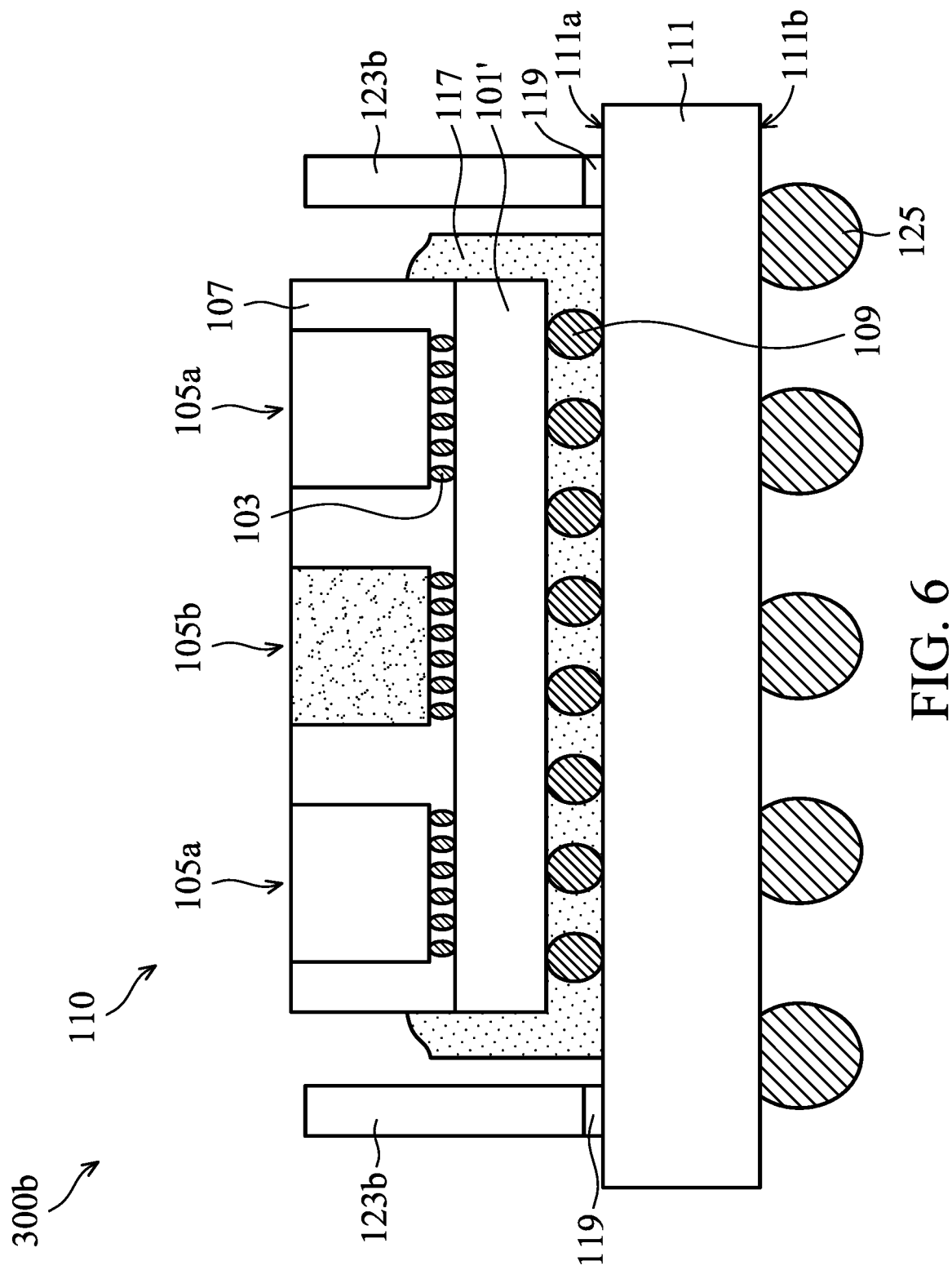
FIG. 6 is a cross-sectional view of a package structure, in accordance with some embodiments of the disclosure.

FIG. 6 is a cross-sectional view of a package structure 300b, in accordance with some embodiments of the disclosure. Some materials and processes used to form the package structure 300b shown in FIG. 6 may be similar to, or the same as, those used to form the package structure 100b shown in FIG. 2 and are not repeated herein.

The differences between the package structure 300a of FIG. 5C and the package structure 300b of FIG. 6 are that a lid 123b, which is different from the lid 123a of package structure 300a, is attached to the first surface 111a, and the heat dissipation paste 121 is not formed over the package component 110 as shown in FIG. 6 in accordance with some embodiments. In some embodiments, the package component 110 is surrounded by the lid 123b, and the top surface of the package component 110 is not coved by the lid 123b.

Figure 7:
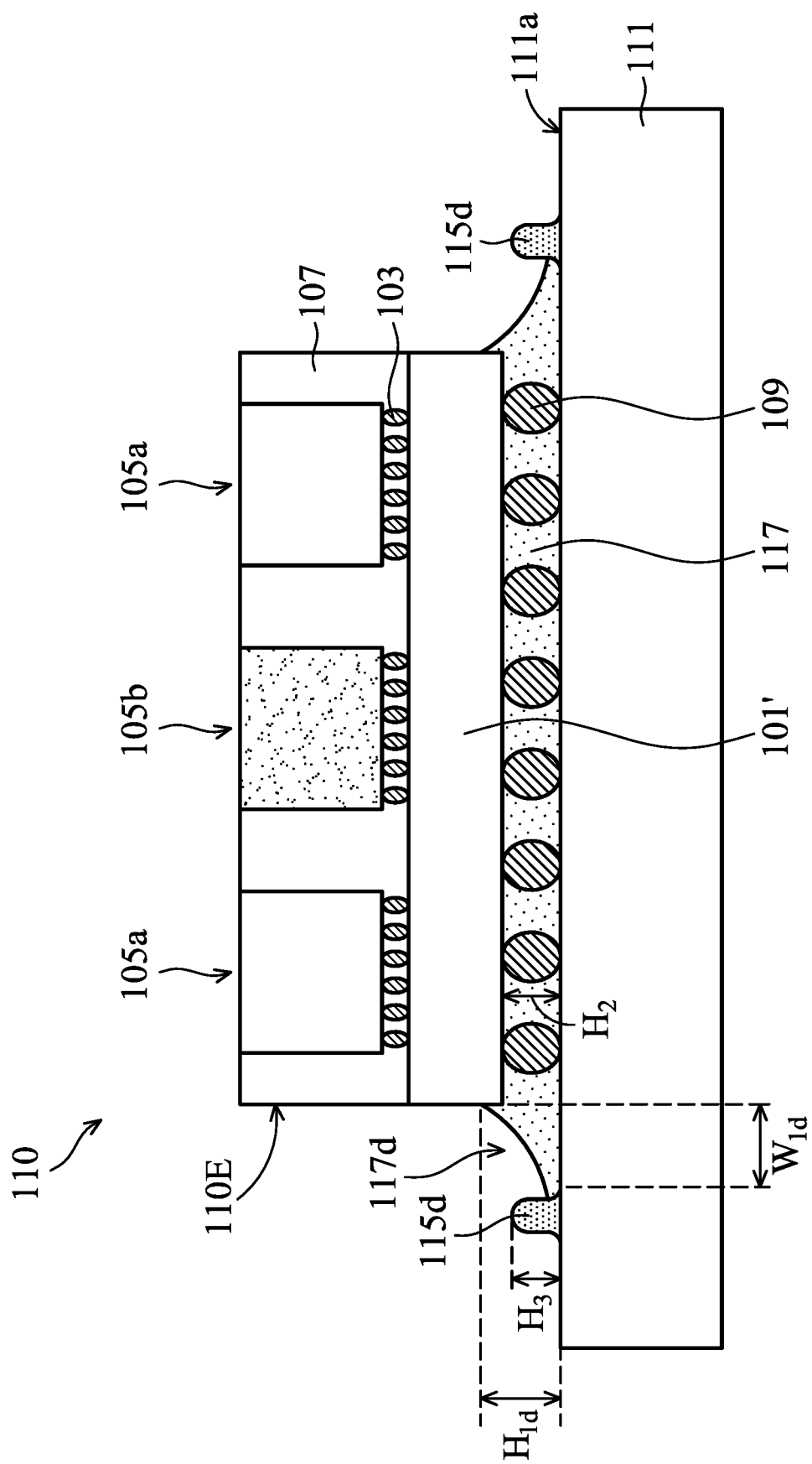
FIG. 7 is a cross-sectional view of a stage of a process for forming a package structure, in accordance with some embodiments of the disclosure.

FIG. 7 is a cross-sectional view of a stage of a process for forming a package structure, in accordance with some embodiments of the disclosure. In some embodiments, a height $H_2$ of the connectors 109 is greater than a maximum height $H_3$ of a dam structure 115d, and a sidewall of the interposer 101' is partially exposed by the underfill layer 117.

In some embodiments, the underfill layer 117 has an extending portion 117d that laterally protrudes from an edge 110E of the package component 110. It should be noted that the extending portion 117d has a width $W_{1d}$ in direct contact with the first surface 111a of the substrate 111, and the width $W_{1d}$ is greater than the width $W_{1a}$ of FIG. 1D, the width $W_{1b}$ of FIG. 3C and width $W_{1c}$ of FIG. 5B, in accordance with some embodiments. However, the extending portion 117d of the underfill layer 117 has a maximum height $H_{1d}$ over the first surface 111a of the substrate 111. In some embodiments, the ratio ($H_{1d}/W_{1d}$) of the maximum height $H_{1d}$ to the width $W_{1d}$ is greater than or equal to about 0.8, and the delamination problem can be mitigated or eliminated.

Figure 8:
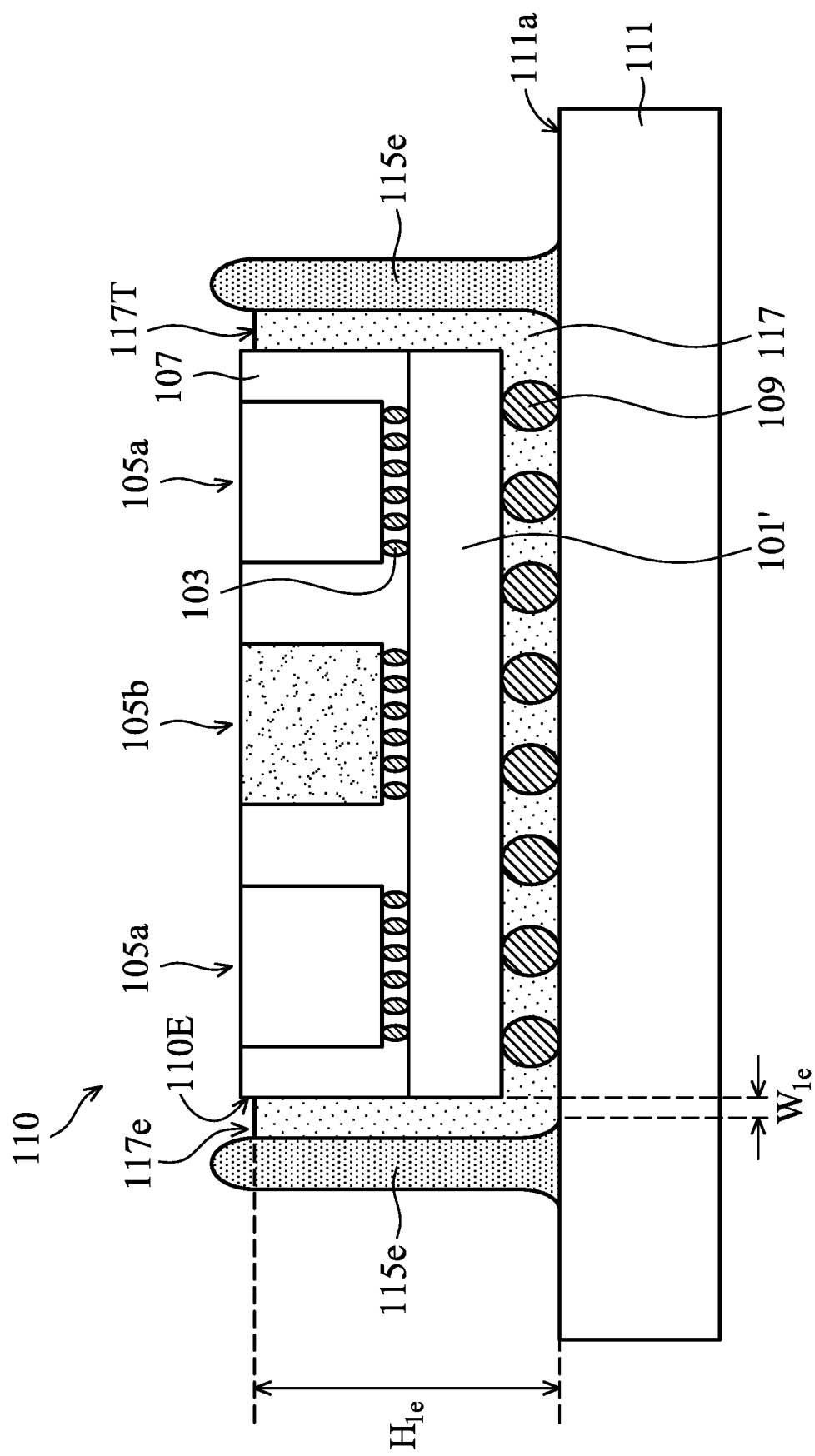
FIG. 8 is a cross-sectional view of a stage of a process for forming a package structure, in accordance with some embodiments of the disclosure.

FIG. 8 is a cross-sectional view of a stage of a process for forming a package structure, in accordance with some embodiments of the disclosure. In some embodiments, a top surface of a dam structure 115e is higher than a top surface of the package component 110, and a sidewall of the molding compound layer 107 is partially exposed by the underfill layer 117. In some embodiments, the underfill layer 117 has an extending portion 117e that laterally protrudes from an edge 110E of the package component 110.

It should be noted that the extending portion 117e has a maximum height $H_{1e}$, and the maximum height $H_{1e}$ is greater than the maximum height $H_{1a}$ of FIG. 1D, the maximum height $H_{1b}$ of FIG. 3C, the maximum height $H_{1c}$ of FIG. 5B, and the maximum height $H_{1d}$ of FIG. 7, in accordance with some embodiments. In addition, the extending portion 117e has a width $W_{1e}$ in direct contact with the first surface 111a of the substrate 111. In some embodiments, the ratio ($H_{1e}/W_{1e}$) of the maximum height $H_{1e}$ to the width $W_{1e}$ is greater than or equal to about 0.8, and the delamination problem can be mitigated or eliminated.

Figure 9:
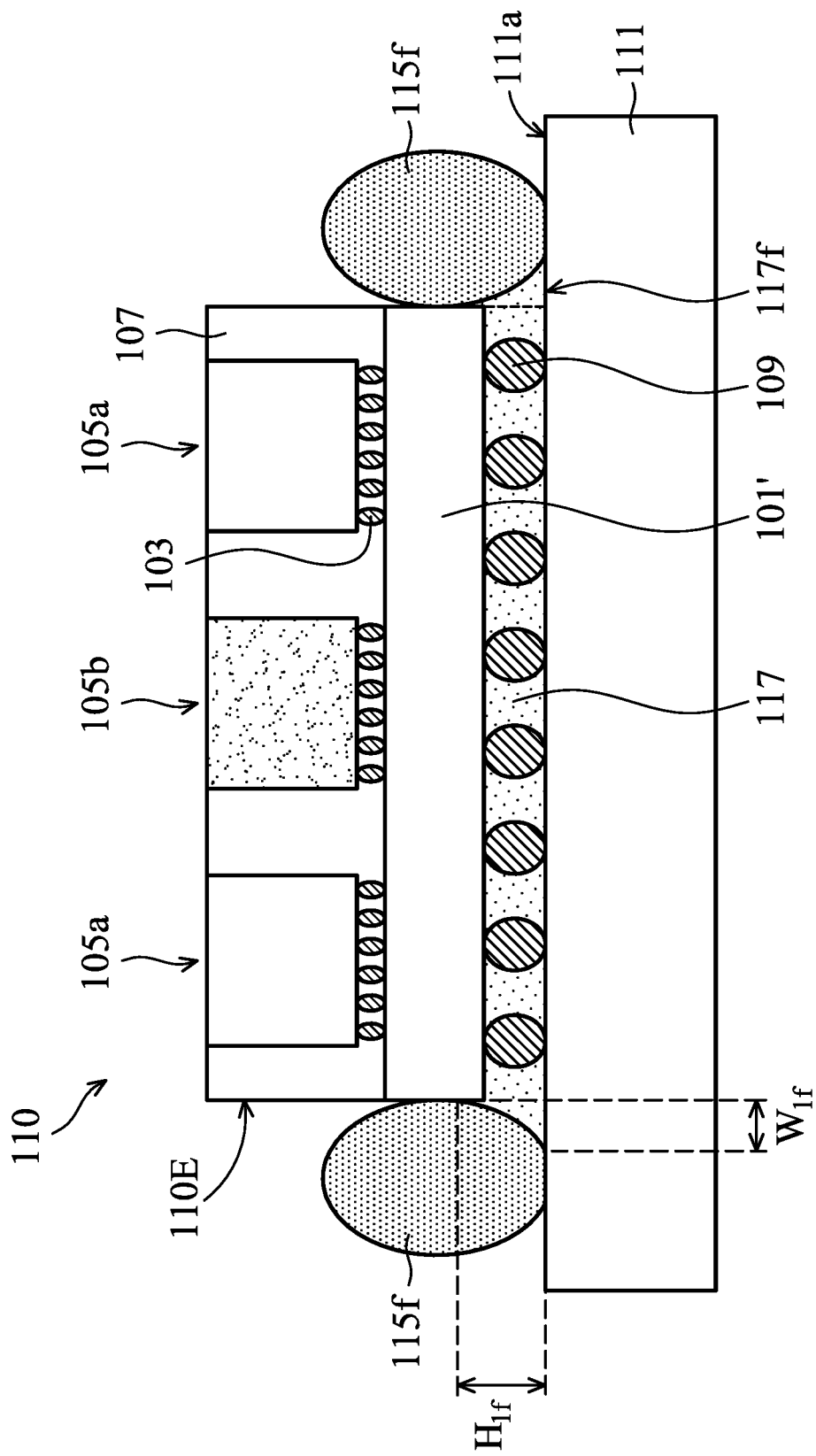
FIG. 9 is a cross-sectional view of a stage of a process for forming a package structure, in accordance with some embodiments of the disclosure.

FIG. 9 is a cross-sectional view of a stage of a process for forming a package structure, in accordance with some embodiments of the disclosure. In some embodiments, a dam structure 115f is formed in direct contact with a sidewall of the package component 110, and the dam structure 115f is formed by some processes similar to that of the dam structure 115b' shown in FIG. 3B.

In some embodiments, the underfill layer 117 has an extending portion 117f that laterally protrudes from an edge 110E of the package component 110. It should be noted that the extending portion 117f has a curved sidewall, and widths of the extending portion 117f gradually increase along a direction from a top of the extending portion 117f to the substrate 111, in accordance with some embodiments.

The extending portion 117f has a maximum height $H_{1f}$, and the extending portion 117e has a width $W_{1f}$ in direct contact with the first surface 111a of the substrate 111. In some embodiments, the ratio ($H_{1f}/W_{1f}$) of the maximum height $H_{1f}$ to the width $W_{1f}$ is greater than or equal to about 0.8, and the delamination problem can be mitigated or eliminated.

FIGS. 10A to 10D are top views of various stages of a process for forming a package structure, in accordance with some embodiments of the disclosure. The package structure may be similar to, or the same as, the aforementioned package structures and are not repeated herein.

Figure 10A:
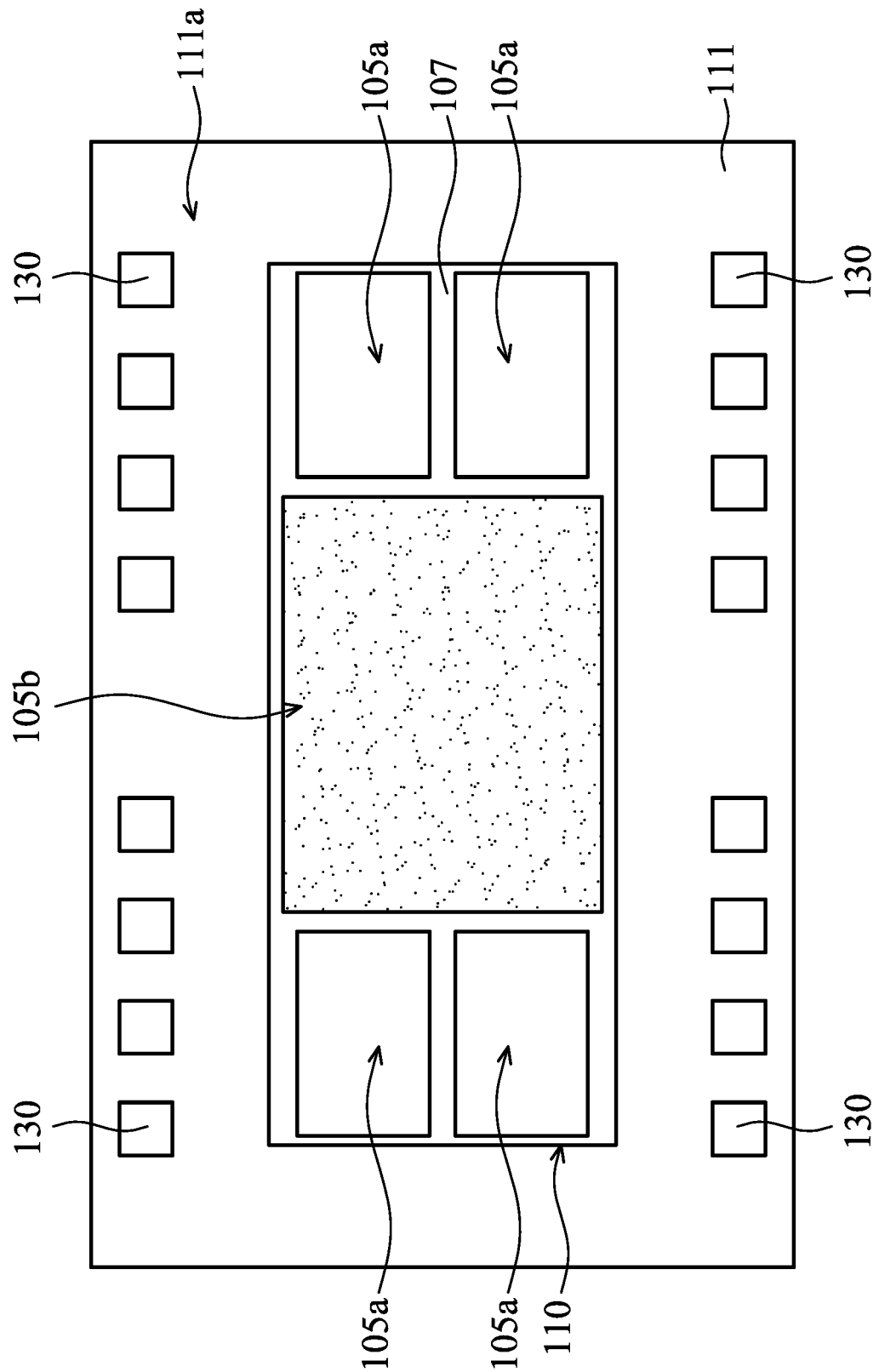
FIGS. 10A to 10D are top views of various stages of a process for forming a package structure, in accordance with some embodiments of the disclosure.

The package component 110 and a plurality of passive components 130 are bonded to the first surface 111a of the substrate 111, as shown in FIG. 10A in accordance with some embodiments. Some materials and processes used to form the package component 110 shown in FIG. 10A may be similar to, or the same as, those used to form the package component 110 shown in FIG. 1A and are not repeated herein.

Although four of the first semiconductor dies 105a and one of the second semiconductor dies 105b are illustrated in each of the package component 110 in FIG. 10A, the number of first semiconductor dies 105a and the number of second semiconductor dies 105b in each of the package component 110 are not limited thereto. In some embodiments, the passive components 130 are disposed around and separated from the package component 110.

Figure 10B:
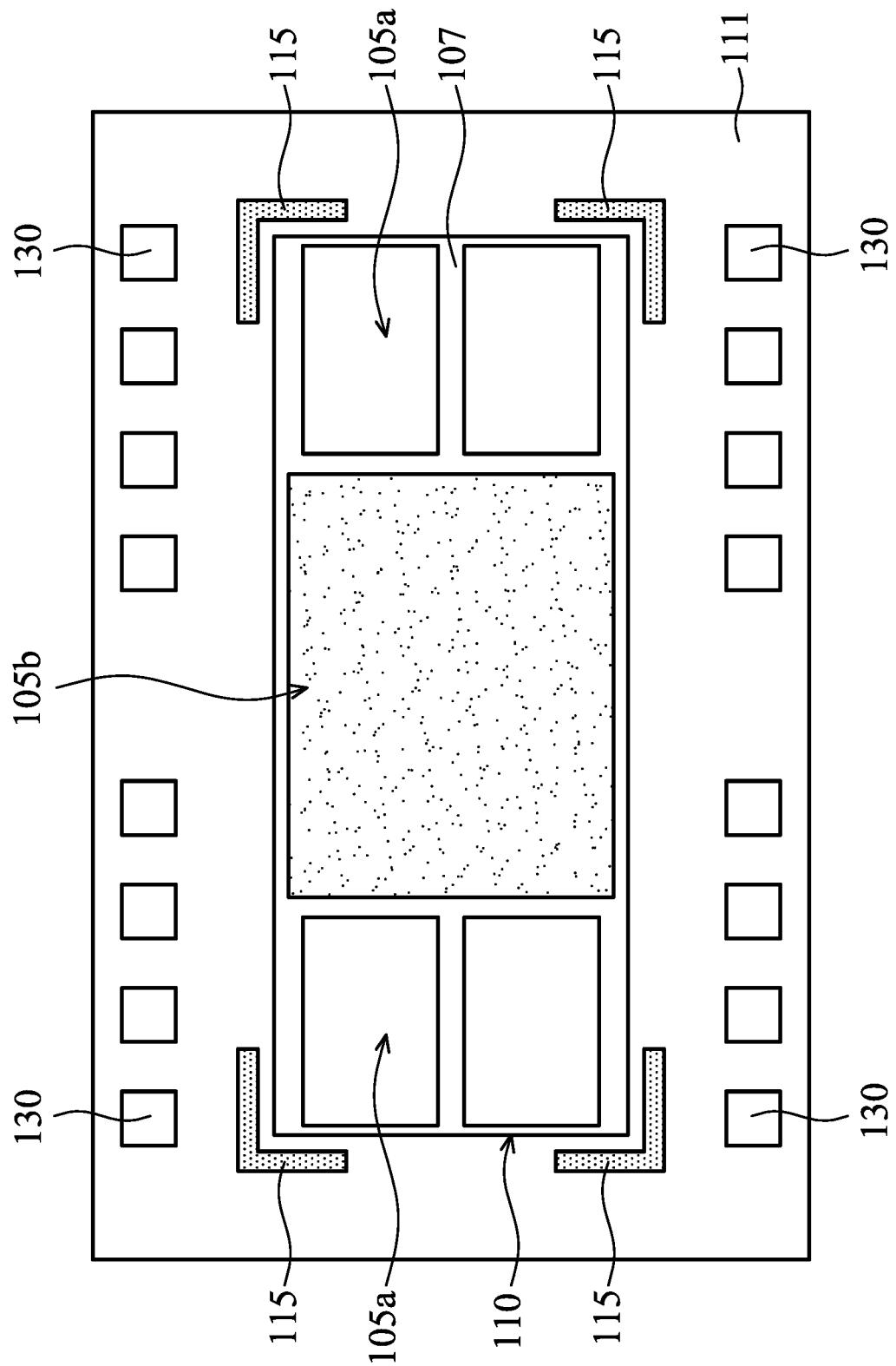

Afterwards, the dam structure 115 is formed between the passive components 130 and the package component 110, as shown in FIG. 10B in accordance with some embodiments. In some embodiments, the dam structure 115 can be the dam structure 115a of FIG. 1C, the dam structure 115b of FIG. 3A, the dam structure 115c of FIG. 5A, the dam structure 115d of FIG. 7, the dam structure 115e of FIG. 8, or the dam structure 115f of FIG. 9.

In addition, the dam structure 115 includes four L-shaped portions, and each of the L-shaped portions is disposed around each of the corners of the package component 110 in the top view of FIG. 10B, in accordance with some embodiments.

Figure 10C:
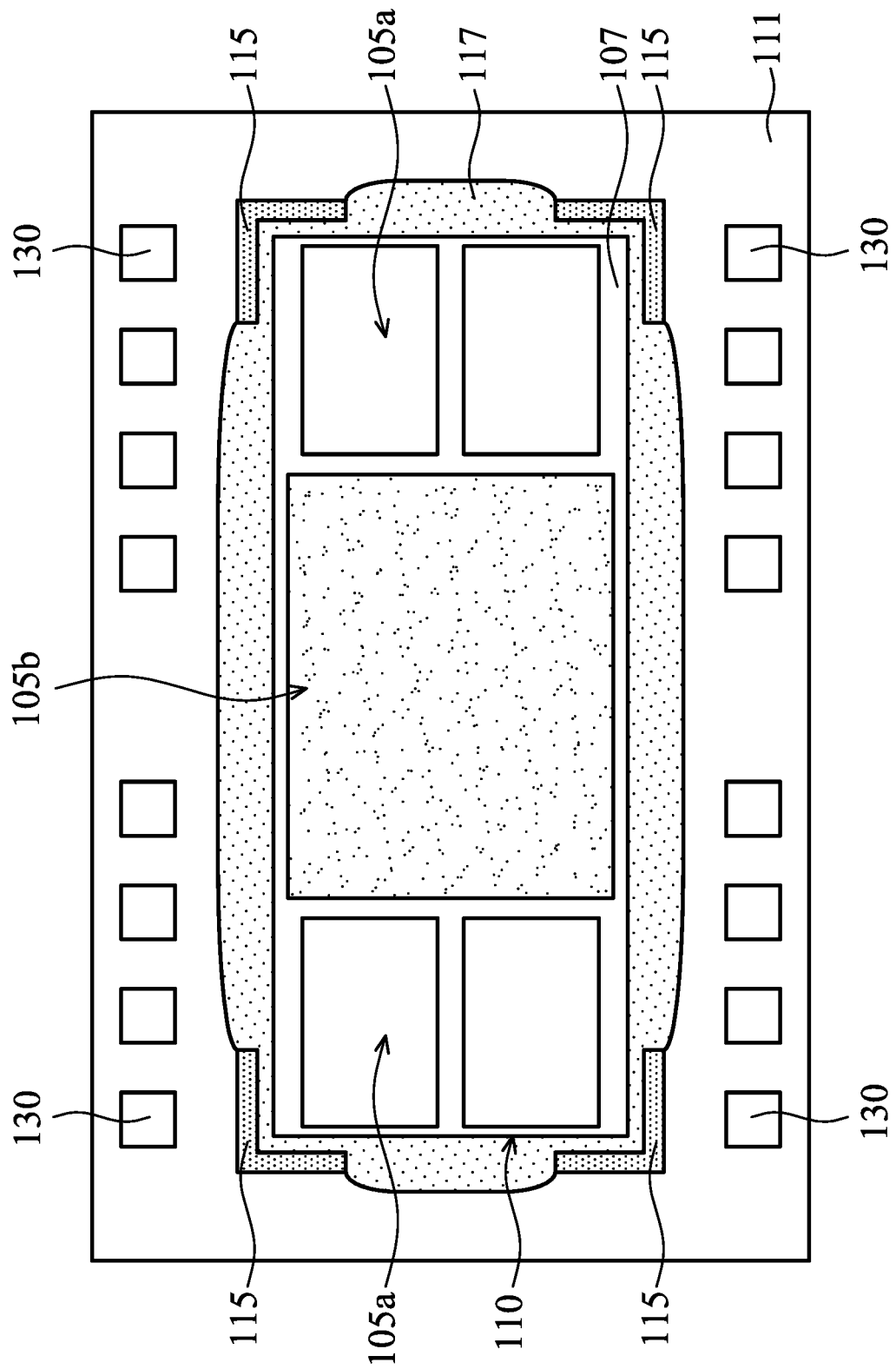

After the dam structure 115 is formed, the underfill layer 117 is formed between the dam structure 115 and the package component 110, as shown in FIG. 10C in accordance with some embodiments. Afterwards, the dam structure 115 is removed by an etching process, as shown in FIG. 10D in accordance with some embodiments.

Figure 10D:
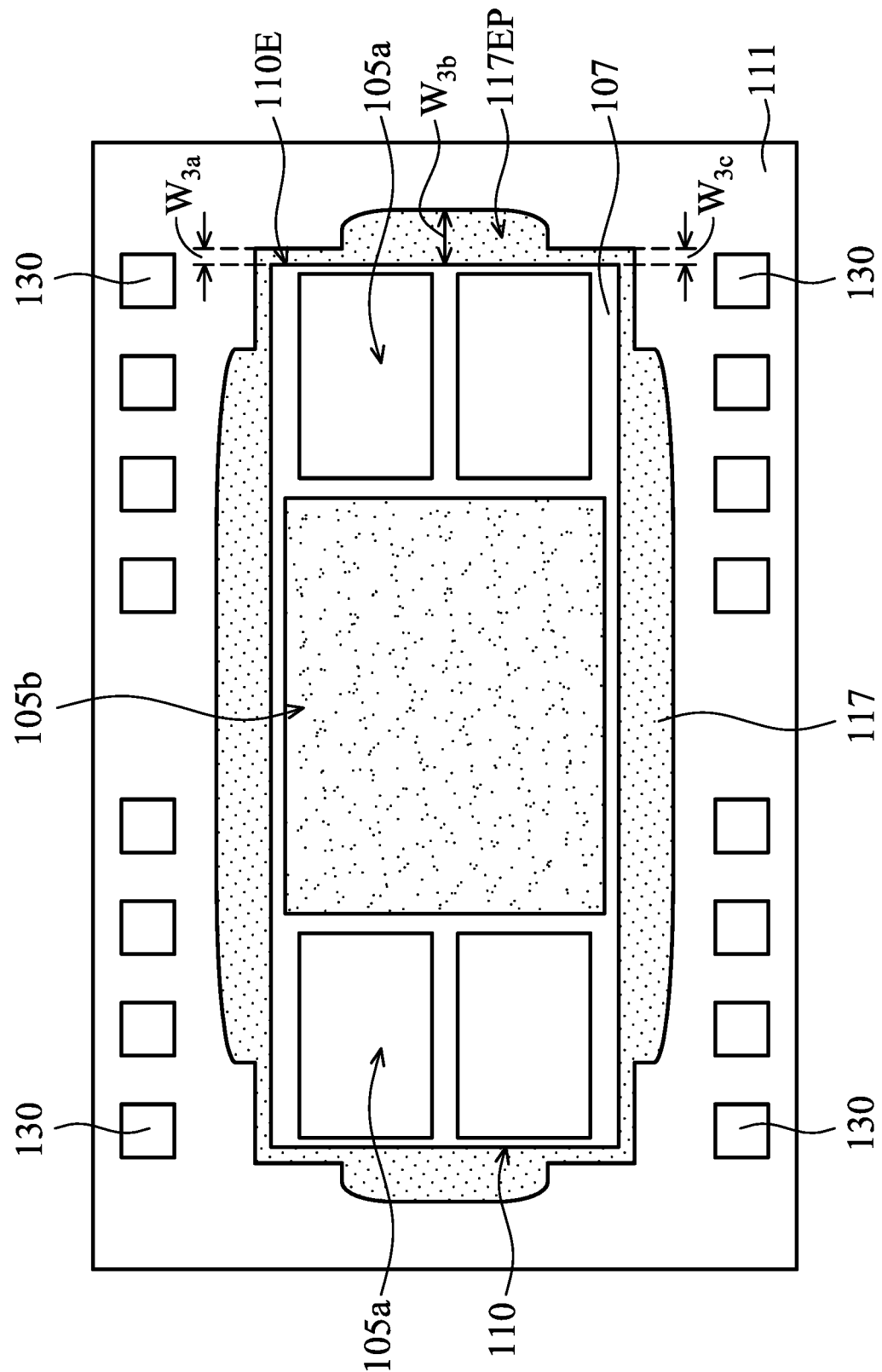

The underfill layer 117 has an extending portion 117EP that laterally protrudes from an edge 110E of the package component 110 as shown in FIG. 10D in accordance with some embodiments. In some embodiments, the extending portion 117EP of the underfill layer 117 can be the extending portion 117a of the underfill layer 117 in FIG. 1D, the extending portion 117b of the underfill layer 117 in FIG. 3B, the extending portion 117c of the underfill layer 117 in FIG. 5B, the extending portion 117d of the underfill layer 117 in FIG. 7, the extending portion 117e of the underfill layer 117 in FIG. 8, or the extending portion 117f of the underfill layer 117 in FIG. 9.

In some embodiments, the extending portion 117EP has a width $W_{3a}$, a width $W_{3b}$ and a width $W_{3c}$ in the top view of FIG. 10D, and the width $W_{3b}$ is between the width $W_{3a}$ and the width $W_{3c}$. In some embodiments, the underfill layer 117 is confined by the L-shaped portions of the dam structure 115, which is disposed around each corner of the package component 110. Therefore, the width $W_{3b}$ is greater than the width $W_{3a}$ and the width $W_{3c}$, in accordance with some embodiments. In addition, in some embodiments, the width $W_{3a}$ is substantially the same as the width $W_{3c}$.

Moreover, most of the delamination problems (e.g., cracks) in the underfill layer 117 occur in the locations around the corners of the package component 110, especially when there are more than one semiconductor dies disposed in the package component 110. Disposing the L-shaped portions of the dam structure 115 around the corners of the package component 110 is an economical way to mitigate or eliminate the problem with lower process cost.

In addition, since the dam structure 115 is disposed between the package component 110 and the passive components 130, the underfill layer 117 may be prevented from contacting the passive components 130, and damages to the passive components 130 can be prevented.

Figure 11A:
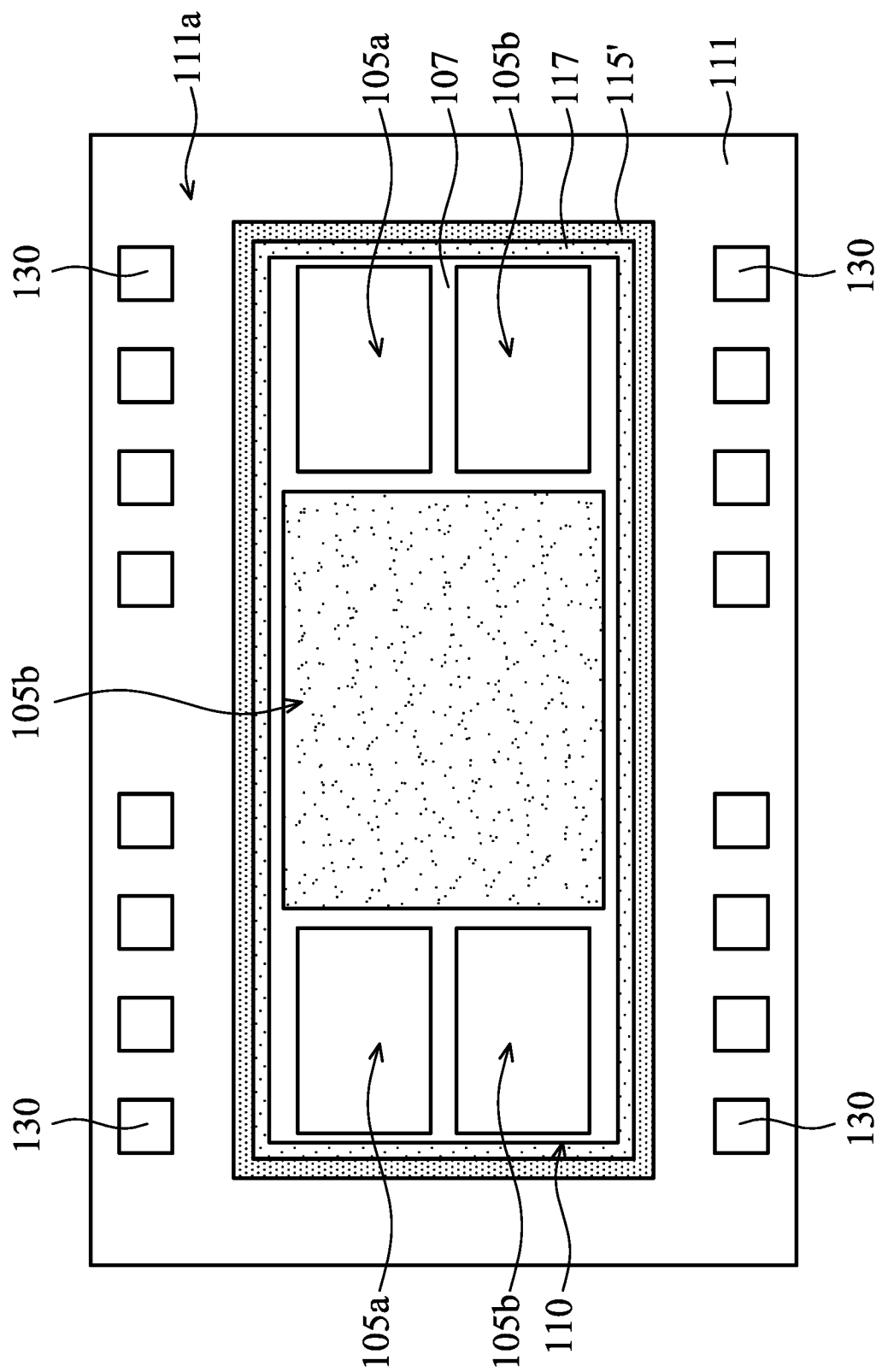
FIGS. 11A to 11B are top views of various stages of a process for forming a package structure, in accordance with some embodiments of the disclosure.
Figure 11B:
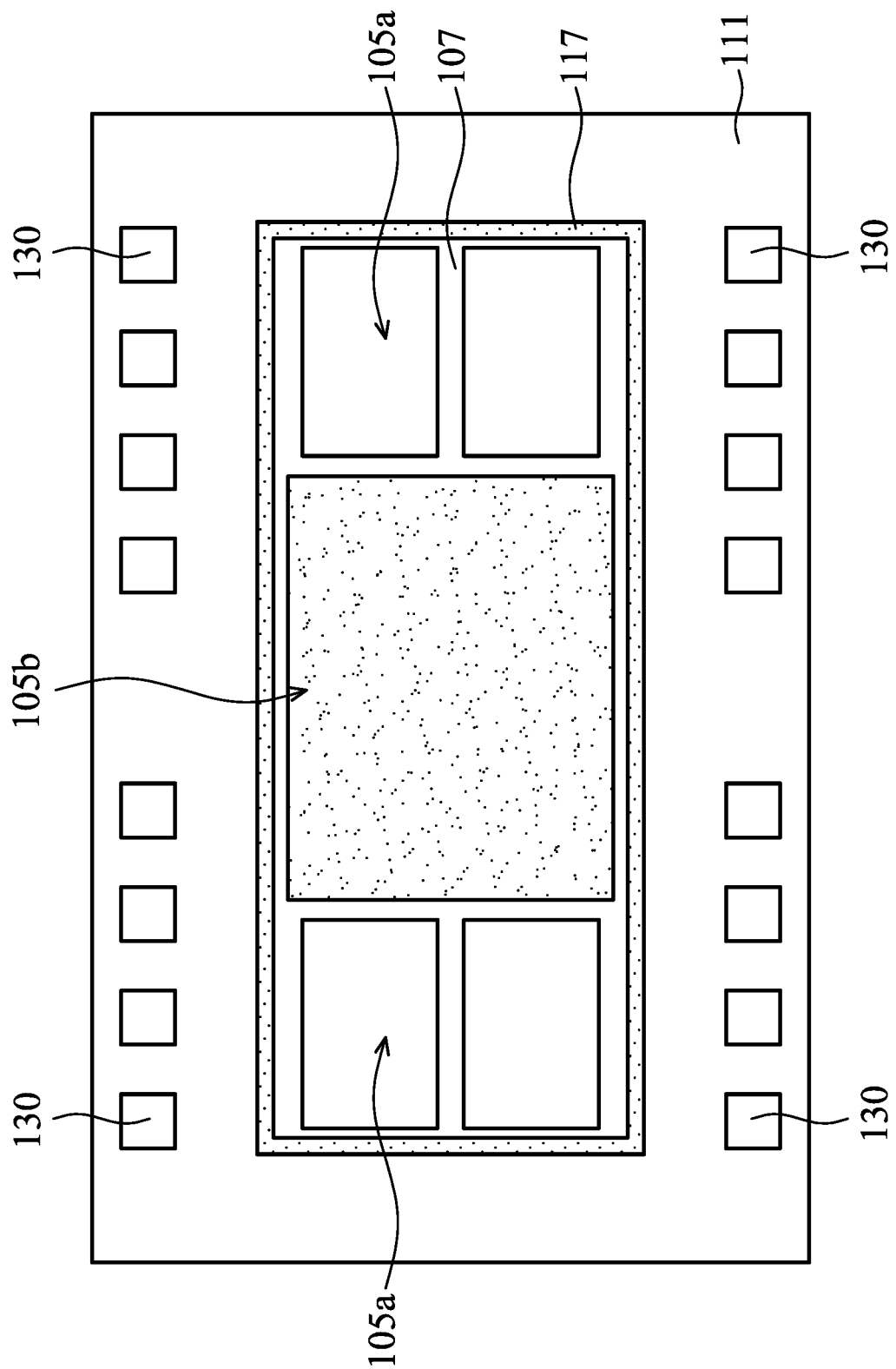

FIGS. 11A to 11B are top views of various stages of a process for forming a package structure, in accordance with some embodiments of the disclosure.

Similar to the structure of FIG. 10C, a dam structure 115' and the underfill layer 117 are formed in FIG. 11A in accordance with some embodiments. The difference between the dam structure 115 of FIG. 10C and the dam structure 115' of FIG. 11A is that the dam structure 115' is formed surrounding the edges of the package component 110, and the underfill layer 117 is enclosed by the dam structure 115 in the top view of FIG. 11A.

Since the dam structure 115' is disposed between the package component 110 and the passive components 130, the underfill layer 117 may be prevented from contacting the passive components 130, and damages to the passive components 130 can be prevented.

In the embodiments of the package structures 100a, 100b, 200a, 200b, 300a, 300b and the aforementioned methods for forming the package structures, the profile and the size (i.e., the ratio ($H_{1a}/W_{1a}$, $H_{1b}/W_{1b}$, $H_{1c}/W_{1c}$, $H_{1d}/W_{1d}$, $H_{1e}/W_{1e}$ and $H_{1f}/W_{1f}$)) of the extending portions (including the extending portions 117a, 117b, 117c, 117d, 117e, 117f and 117EP) of the underfill layer 117 may be controlled and confined by the dam structures (including the dam structures 115a, 115b, 115c, 115d, 115e, 115f, 115 and 115'). Therefore, the delamination problem in the underfill layer 117 may be mitigated or eliminated.

Moreover, since the dam structures allow reduction of the size of the substrate 111 by allowing the width (e.g., the widths $W_{1a}$, $W_{1b}$, $W_{1c}$, $W_{1d}$, $W_{1e}$ and $W_{1f}$) of the extending portions (including the extending portions 117a, 117b, 117c, 117d, 117e, 117f and 117EP) of the underfill layer 117 to be reduced, and the dam structures (including the dam structure 115a, 115b, 115c, 115d, 115e, 115f, 115 and 115') are removed after the underfill layer 117 is formed, the sizes of the package structures 100a, 100b, 200a, 200b, 300a, 300b can be reduced.

Embodiments of a package structure and methods for forming the same are provided. The method for forming the package structure may include bonding a package component to a substrate, forming a dam structure over the substrate, forming an underfill layer between the dam structure and the package component, and removing the dam structure after the underfill layer is formed. The package component includes an interposer and a plurality of semiconductor dies over the interposer. Since there are more than one semiconductor dies in the package component, delamination problem (e.g., cracks) may easily occur in the portions of the underfill layer around the corners of the package component. By forming the underfill layer between the dam structure and the package component, the size and profile of the underfill layer may be controlled. Therefore, delamination problem, such as cracks grown in the underfill layer along the interface between the package component and the underfill layer, may be mitigated or eliminated.

In some embodiments, a method for forming a package structure is provided. The method includes bonding a package component to a substrate through a plurality of first connectors. The package component comprises a first semiconductor die and a second semiconductor die. The method also includes forming a dam structure over the substrate and surrounding the first connectors. A top surface of the dam structure is lower than a bottom surface of the package component. The method further includes filling an underfill layer in a space between the dam structure and the first connectors. In addition, the method includes removing the dam structure after the underfill layer is formed.

In some embodiments, a method for forming a package structure is provided. The method includes bonding a package component to a substrate. The package component comprises an interposer, a plurality of semiconductor dies bonding to the interposer and a molding compound layer over the interposer and surrounding the plurality of semiconductor dies. The method also includes forming a dam structure over the substrate and surrounding the package component. The method further includes forming an underfill layer surrounding the package component and surrounded by the dam structure. A portion of the underfill layer protrudes from an edge of the dam structure in a top view. In addition, the method includes removing the dam structure after the underfill layer is formed.

In some embodiments, a method for forming a package structure is provided. The method includes forming a package component over a substrate. The package component comprises a first semiconductor die and a second semiconductor die. The method also includes forming a dam structure over the substrate. The package component is surrounded by the dam structure. The method further includes filling an underfill layer in a space between the dam structure and the package component. In addition, the method includes curing the underfill layer. The space between the dam structure and the package component decreases after the underfill layer is cured. The method also includes removing the dam structure after the underfill layer is cured.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a package structure, comprising:
   bonding a package component to a substrate through a plurality of first connectors, wherein the package component comprises a first semiconductor die and a second semiconductor die;
   forming a dam structure over the substrate and surrounding the first connectors, wherein a top surface of the dam structure is lower than a bottom surface of the package component, wherein the material of the dam structure is a 2D cross-linking polymer;
   filling an underfill layer in a space between the dam structure and the first connectors; and
   removing the dam structure after the underfill layer is formed.

2. The method for forming the package structure as claimed in claim 1, wherein forming the package component comprises:
   bonding the first semiconductor die and the second semiconductor die to an interposer wafer through a plurality of second connectors;
   forming a molding compound layer over the interposer wafer and laterally surrounding the first semiconductor die and the second semiconductor die; and
   dicing the molding compound layer and the interposer wafer to form the package component.

3. The method for forming the package structure as claimed in claim 1, further comprising:
   attaching a lid over the substrate through an adhesive layer and a heat dissipation paste after the dam structure is removed.

4. The method for forming the package structure as claimed in claim 3, wherein the adhesive layer is in direct contact with the substrate, and the heat dissipation paste is in direct contact with the first semiconductor die of the package component.

5. The method for forming the package structure as claimed in claim 1, further comprising:
   attaching a lid over the substrate through an adhesive layer after the dam structure is removed, wherein the package component is surrounded by the lid.

6. The method for forming the package structure as claimed in claim 5, wherein a top surface of the package component is exposed from the lid.

7. The method for forming the package structure as claimed in claim 1, wherein a portion of the underfill layer protrudes from an edge of the dam structure in a top view.

8. A method for forming a package structure, comprising:
   bonding a package component to a substrate, wherein the package component comprises:
   an interposer;
   a plurality of semiconductor dies bonding to the interposer; and
   a molding compound layer over the interposer and surrounding the plurality of semiconductor dies;
   forming a dam structure over the substrate and surrounding the package component;
   forming an underfill layer surrounding the package component and surrounded by the dam structure, wherein a portion of the underfill layer protrudes from an edge of the dam structure in a top view; and
   removing the dam structure after the underfill layer is formed.

9. The method for forming the package structure as claimed in claim 8, wherein the dam structure is made of an acrylic-based polymer.

10. The method for forming the package structure as claimed in claim 8, wherein the plurality of semiconductor dies comprises a plurality of first semiconductor dies and a second semiconductor die surrounded by the plurality of first semiconductor dies.

11. The method for forming the package structure as claimed in claim 10, wherein the second semiconductor die is greater than each of the plurality of first semiconductor dies.

12. The method for forming the package structure as claimed in claim 10, wherein a first distance between the underfill layer and each of the plurality of first semiconductor dies is greater than a second distance between the underfill layer and the second semiconductor die in the top view.

13. The method for forming the package structure as claimed in claim 8, wherein the underfill layer is in direct contact with an inner sidewall of the dam structure and a connect sidewall of the dam structure in the top view, wherein the connect sidewall of the dam structure connects the inner sidewall of the dam structure and an outer sidewall of the dam structure.

14. The method for forming the package structure as claimed in claim 8, further comprising:
    forming a passive component over the substrate, wherein the passive component is separated from the dam structure and the underfill layer.

15. The method for forming the package structure as claimed in claim 14, wherein a third distance between the dam structure and the passive component is greater than a fourth distance between the underfill layer and the passive component in the top view.

16. A method for forming a package structure, comprising:
    forming a package component over a substrate, wherein the package component comprises a first semiconductor die and a second semiconductor die;
    forming a dam structure over the substrate, wherein the package component is surrounded by the dam structure;
    filling an underfill layer in a space between the dam structure and the package component;
    curing the underfill layer, wherein the space between the dam structure and the package component decreases after the underfill layer is cured; and
    removing the dam structure after the underfill layer is cured.

17. The method for forming the package structure as claimed in claim 16, wherein the dam structure deforms during the underfill layer is cured.

18. The method for forming the package structure as claimed in claim 16, wherein a top surface of the dam structure is higher than a top surface of the underfill layer before the underfill layer is cured.

19. The method for forming the package structure as claimed in claim 16, wherein a top surface of the dam structure is lower than a top surface of the underfill layer after the underfill layer is cured.

20. The method for forming the package structure as claimed in claim 16, wherein forming the dam structure comprises:
    dispensing a polymer material on the substrate by a dispensing tool; and
    curing the polymer material.

* * * * *